US007079223B2

(12) United States Patent
Rosenbluth et al.

(10) Patent No.: US 7,079,223 B2
(45) Date of Patent: Jul. 18, 2006

(54) FAST MODEL-BASED OPTICAL PROXIMITY CORRECTION

(75) Inventors: Alan E. Rosenbluth, Yorktown Heights, NY (US); Gregg M. Gallatin, Newtown, CT (US); Ronald L. Gordon, Poughkeepsie, NY (US); Nakgeuon Seong, Wappingers Falls, NY (US); Alexey Y. Lvov, Tarrytown, NY (US); William D. Hinsberg, Fremont, CA (US); John A. Hoffnagle, San Jose, CA (US); Frances A. Houle, Fremont, CA (US); Martha I. Sanchez, Menlo Park, CA (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 10/783,938

(22) Filed: Feb. 20, 2004

(65) Prior Publication Data

US 2005/0185159 A1 Aug. 25, 2005

(51) Int. Cl.
*G03B 27/42* (2006.01)

(52) U.S. Cl. .......................... 355/67; 355/69; 355/53; 716/19

(58) Field of Classification Search .................... None
See application file for complete search history.

(56) References Cited

U.S. PATENT DOCUMENTS 6,563,566 B1 * 5/2003 Rosenbluth et al. .......... 355/67

6,738,859 B1 * 5/2004 Liebchen ...................... 716/19

OTHER PUBLICATIONS

"Method Of Measuring The Spatial Resolution Of A Photoresist"—J.A. Hoffnagle, et al. 2002 Optical Society of America—p. 1776.
"Reduction Of ASIC Gate-Level Line-End Shortening By Mask Compensation"—J. Garofalo, et al. SPIE vol. 2440—Optical/Laser Microlithography VIII—p. 171.
"Improved Modeling Performance With An Adapted Vectorial Formulation Of The Hopkins Imaging Equation"—Adam, et al.—p. 78-91.
Simulation Of Imaging And Stray Light Effects In Immersion Lithography—Hafeman, et al. SPIE vol. 5040—Optical Microlithography XVI, ed. Anthony Yen (2003), p. 700.

* cited by examiner

*Primary Examiner*—D. Rutledge
(74) *Attorney, Agent, or Firm*—Ira D. Blecker

(57) ABSTRACT

A method and system is provided for computing lithographic images that may take into account non-scalar effects such as lens birefringence, resist stack effects, tailored source polarizations, and blur effects of the mask and the resist. A generalized bilinear kernel is formed, which is independent of the mask transmission function, and which may then be treated using a decomposition to allow rapid computation of an image that includes such non-scalar effects. Weighted pre-images may be formed from a coherent sum of pre-computed convolutions of the dominant eigenfunctions of the generalized bilinear kernel with the appropriate mask polygon sectors. The image at a point may be formed from the incoherent sum of the weighted pre-images over all of the dominant eigenfunctions of the generalized bilinear kernel. The resulting image can then be used to perform model-based optical proximity correction (MBOPC).

24 Claims, 7 Drawing Sheets

- 541 Grid Image Plane within ROI Integration Domain
- 542 Fold ROI Integration Domain According to System Symmetry
- 543 Tablulate GBK at Grid Points in Folded ROI Integration Domain
- 544 Remap Tabulated GBK to a Reduced Basis
- 545 Calcualte Eigenfunctions of GBK in Reduced Basis and Convert to Initial Grid
- 546 Iteratively Refine Dominant Eigenfunctions against Tablulated GBK
- 547 Precompute Convolutions of Dominant Eigenfunctions with Mask Polygon Sectors

FAST MODEL-BASED OPTICAL PROXIMITY CORRECTION

TECHNICAL FIELD

The present invention relates in general to manufacturing processes that require lithography and, in particular, to methods of designing photomasks and optimizing lithographic and etch processes used in microelectronics manufacturing.

BACKGROUND INFORMATION

Today's integrated circuits (ICs) contain features which are not easily resolved by available lithography tools, so proper printing of critical feature dimensions (CDs) requires that compensating adjustments be made to the IC shapes deployed on the mask. In so-called model-based optical-proximity-correction (MBOPC), the appropriate adjustments are determined by simulating the lithographic process, and in particular, providing a means to simulate the image at the wafer plane. Ultimately, a determination of the image formed in the resist layer (e.g. the latent resist image) is desired, but often the aerial image at the wafer plane is used as an approximation for the latent image in the resist.

Conventional image simulation is typically done using the Hopkins integral for scalar partial coherent image formation, where the expression for the aerial image intensity $I_0$ is given by, $$I_0(\vec{r}) = \iiint d\vec{r}\,' d\vec{r}\,'' h(\vec{r}-\vec{r}\,') h^*(\vec{r}-\vec{r}\,'') m(\vec{r}\,') m^*(\vec{r}\,''), \quad \text{Equation 1}$$

where, h is the lens impulse response function (also known as the point spread function or PSF);
j is the coherence;
m is the mask transmission function;
* indicates the complex conjugate; and
$\vec{r}$ is the position of the image.

The integration is typically performed over the mask. The expression:

$$h(\vec{r}-\vec{r}\,') h^*(\vec{r}-\vec{r}\,'') j(\vec{r}\,'-\vec{r}\,'') \quad \text{Equation 2}$$

is known as the Hopkins kernel, which is a fixed two-dimensional (2D) function for a given system.

This 4-dimensional (4D) Hopkins integral (Equation 1) may be approximated as an incoherent sum of 2-dimensional (2D) coherent image integrals. This method of computing the Hopkins integral is known as the sum of coherent systems (SOCS) procedure. In the SOCS procedure, an optimal n-term approximation to the partially coherent Hopkins integral is:

$$I_0(\vec{r}) \cong \sum_{k=1}^{n} \lambda_k |(m \otimes \phi_k)(\vec{r})|^2, \quad \text{Equation 3}$$

where represents the two-dimensional (2D) convolution operation, $\lambda_k$, $\phi_k(\vec{r})$ represent the $k^{th}$ eigenvalue and eigenfunction of the Hopkins kernel, respectively, derived from the Mercer expansion of:

$$h(\vec{r}\,') h^*(\vec{r}\,'') j(\vec{r}\,'-\vec{r}\,'') = \sum_{k=1}^{\infty} \lambda_k \phi_k(\vec{r}\,') \phi_k(\vec{r}\,''), \quad \text{Equation 4}$$

which suggests that a partially coherent imaging problem can be optimally approximated by a finite sum of coherent images obtained, for example, by linear convolution. Typically, the source and the mask polygons are decomposed (e.g. into grids or sectors), and each field image is computed as an incoherent sum of coherent sub-images (also referred to as component-images, or pre-images). The total intensity at an image point $\vec{r}$ in question is then the sum over all component images. In the SOCS approximation, the number of coherent sub-images that must be calculated is minimized, for example, by diagonalizing the image matrix to achieve an acceptable approximate matrix of minimal rank by eigenvalue decomposition. For example, even a large-fill source can be adequately approximated when the number of 2D convolutions n is about 10.

The mask transmission function, m, which can be approximated by a binary mask design pattern, usually consisting of polygons of one or more transmission, can be represented in different ways, such as grid cells or a sector decomposition, and the image at a point $\vec{r}$ may be represented by a finite incoherent sum of weighted coherent convolutions of the mask transmission function m and the eigenfunctions $\phi_k$. Each of the eigenfunctions, and its convolution with a possible mask sector, may be pre-computed, thus providing a fast method of computing the aerial image $I_0$. The aerial image is often assumed to be an adequate approximation of the resist latent image. To account for resist effects, previous methods have used post processing the aerial image by applying a lumped parameter model or by applying resist blurring. However, in extending model-based-optical-proximity-correction (MBOPC) to the sub-100 nm dimensions of next-generation IC products, the prior art has a number of limitations.

For example, the scalar treatment is applicable for numerical apertures (NAs) less than about 0.7, where the angle between interfering orders is fairly small in resist, so that the electric fields in different beams are almost perpendicular or anti-perpendicular when they interfere. Under these circumstances, superposition is almost scalar. However, numerical apertures (NAs) of at least 0.85 must be employed when extending optical lithography to the sub-100 nm dimensions. At the resulting steep obliquities the standard scalar Hopkins integral becomes inaccurate, and the vector character of the electric field must be considered. It is known that this can be accomplished by calculating independent images in each of the global Cartesian coordinates of the electric field ($E_x$, $E_y$, $E_z$), and then summing these images over each of the allowed orientations of the illuminating polarization, and again over each of the different source directions that illuminate the mask. However, the computational efficiency of this procedure is not adequate for MBOPC.

Adam et al. (K. Adam, Y. Granik, A. Torres and N. B. Cobb, "Improved modeling performance with an adapted vectorial formulation of the Hopkins imaging equation," in SPIE vol. 5040, Optical Microlithography XVI, ed. Anthony Yen (2003), p. 78–91) and Hafeman et al. (in SPIE vol. 5040, Optical Microlithography XVI, ed. Anthony Yen (2003), p. 700) disclosed an extension of the scalar Hopkins imaging equation to include vectorial addition of the electromagnetic (EM) field inside a film. However, the approaches of Adam et al. and Hafeman et al. ignore the z-component of the field, and do not take into account effects such as lens birefringence, tailored source polarization, or blur from the resist or mask.

The scalar treatment of image formation ignores illumination polarization, and assumes that the lens and resist surfaces introduce negligible partial polarization. However, OPC for future lithography will also have to take into account the polarization properties of the lens itself. As NA and lens complexity increases, the polarization state of the output beam is changed by cumulative polarization-dependent reflection losses that arise at the surfaces of the lens elements. Attainable performance in the antireflection coatings that inhibit these losses will become increasingly poor as wavelength decreases into the deep ultraviolet (UV). Forthcoming 157 nm lenses will be birefringent even in their bulk substrates, due to spatial dispersion in the element substrates. Skew incidence at beamsplitter and other coatings will distort the light polarization. There is also interest in sources that deliberately introduce polarization variations between rays in order to minimize the contrast loss that arises in transverse magnetic (TM) polarization at high NA (i.e. polarization-tailored sources). The exposed image is also impacted by the resist film stack, due to multiple polarization-dependent reflections between the various interfaces. The anti-reflective (AR) films that inhibit these reflections can be less effective over the broad angular ranges that arise at high NA. Refraction at the top surface of the resist gives rise to spherical aberration in the transmitted image.

Finally, minimum feature sizes in next generation ICs are beginning to approach the resolution of the photoresist, and this must be taken into account during MBOPC.

Methods are known for modeling each of these phenomena over mask areas of modest size. Vector images can be calculated by summing over all illumination and image-plane polarizations, and over all source points.

Resist blur may occur due to the finite resolution of the resist. Propagation in spatially dispersive media has been treated in the physics literature, and this analysis has now been applied to 157 nm lithographic lenses. Finite resist resolution can be treated in an approximate way by blurring the exposed optical image using a resist kernel, which in the frequency domain is equivalent to frequency filtering the 4D Hopkins integral. It is known that a post-exposure blurring in the resist arises in the chemical image that is acted on by the resist developer; this resist blurring can be accounted for by convolution of the optical image with a blur function, or equivalently by attenuation of the image spatial frequency content by a modulation transfer function (for example, see J. Garofalo et al., "Reduction of ASIC Gate-Level line-end shortening by Mask Compensation," in *SPIE v.2440—Optical/Laser Microlithography VIII*, ed. Timothy A. Brunner (SPIE, 1995), p. 171.). Hoffnagle et al. (in "Method of measuring the spatial resolution of a photoresist," *Optics Letters* 27, no.20 (2002): p. 1776.) have shown that the resist modulation transfer function (also known as the effective resist MTF) can be determined for a particular spatial frequency from critical dimension (CD) measurements in resist that has been exposed to a pair of interfering sine waves (this interference pattern exhibiting essentially 100% optical contrast). The latent image contrast deduced in this way can be substantially less than 100%, and this modulation loss becomes steadily more important as feature-sizes come closer to the resolution limit of resists. For example, at a pitch of 225 nm, the UV2 resist analyzed in Hoffnagle et al. transfers to the latent chemical image only about 50% of the modulation in the exposing optical image. More modest contrast losses arise even at relatively coarse spatial frequencies, and can give rise to proximity effects of relatively long range.

However, such methods to account for resist blurring involve a direct spatial domain convolution of the resist blur function with the continuous optical image, which is relatively slow to compute, as compared to the polygons of the kind that are deployed on the mask, which are relatively simple to handle, and can be relatively fast to compute. Unfortunately, future MBOPC will only be practical if a way can be found to calculate these effects very quickly.

Other aspects of the MBOPC process (e.g. etch simulation, simulation of mask electromagnetic effects, polygon edge adjustment, as well as many non-lithographic issues) are not directly considered in the present discussion; however, it is important to bear in mind that lithographic simulation is only one small aspect of the full IC design process. Mask polygons must be stored in a recognized data structure of complex hierarchical organization; the patterns are arrived at after considerable effort that involves a long succession of circuit and device design software. Additional processing software converts the post-OPC shapes to a format used in mask writing. Because of the complexity of this computer-aided design (CAD) process, it has become customary to use suites of software design tools (including tools for MBOPC) to avoid problems when migrating the chip data from one stage of the design process to the next. Improved MBOPC methods must be compatible with this design flow. It is also desirable that improved methods for lithographic simulation be compatible with existing OPC programs.

The SOCS method gives a fast and accurate enough algorithm for computing the scalar aerial image (AI). This would be enough to satisfy and even exceed any practical requirements if only the AI was needed as the final output of the algorithm. However, because of the presence of the resist development step, further computation is needed to get the resist image from the AI.

Images obtained using the SOCS method are calculated by pre-storing the corresponding images of all possible semi-infinite sectors from which the mask polygons are composed. The images of polygonal mask features can therefore be calculated very rapidly.

These pre-stored tables are based only on the scalar Hopkins integral. To take into account such phenomena as resist resolution, vector imaging, resist thin-film effects, illumination polarization, and lens birefringence, we need to obtain new tables that are able to reproduce the effects of these phenomena as if the phenomena arose from an incoherent sum of coherent images.

Accordingly, there is a need for an efficient method of simulating images that more accurately includes non-scalar effects (i.e. "non-Hopkins" effects) including the vector electric field, polarization effects, and is applicable for computing a variety of images including an aerial image or a resist image. In addition, it would be desirable to implement such a method that can be incorporated into existing computer codes without significant restructuring of the code.

SUMMARY OF THE INVENTION

Bearing in mind the problems and deficiencies of the prior art, it is therefore object of the present invention to provide a fast method for computing images that takes into account non-scalar (i.e. "non-Hopkins") effects.

It is a further objective of the present invention to provide a fast method of computing non-scalar images that can be incorporated into existing computer codes without significant restructuring of such codes.

Still other objects and advantages of the invention will in part be obvious and will in part be apparent from the specification.

In accordance with the present invention, an efficient method and system is provided for computing lithographic images that takes into account vector effects such as lens birefringence, resist stack effects and tailored source polarizations, and may also include blur effects of the mask and the resist. In accordance with the present invention, these effects are included by forming a generalized bilinear kernel, which can then be treated using a SOCS decomposition to allow rapid computation of an image that includes such non-scalar effects. A source intensity distribution $S(\vec{k}_s)$ is provided. The source can be characterized by an intensity distribution $S(\vec{k}_s)$, and may be characterized by independent polarizations m, each of which is characterized by a polarization map. A projection impulse response function $\vec{h}_m$ is provided, which preferably includes the vector impulse response function of the lens including lens birefringence, but may also be generalized to include vector effects in the resist film stack. Furthermore, in the case of a source with tailored polarization, the projection impulse response function $\vec{h}$ may also include a source polarization map. A generalized bilinear kernel $V(\vec{r}', \vec{r}')$ is formed by forming a bilinear autocorrelation of the source intensity distribution $S(\vec{k}_s)$ with the vector impulse response function $\vec{h}(\vec{k}', \vec{k}_s)$. A generalized bilinear kernel can be formed to include mask blur. Resist blur may be included in a generalized bilinear kernel, for example, where averaging over the depth of the resist stack and/or a range of focus positions may be performed. Preferably, a SOCS decomposition of the generalized bilinear kernel is performed. The generalized bilinear kernel V is formed so as to be independent of the mask transmission function $m(\vec{r})$. In another aspect of the present invention, the image $I(\vec{r})$ at a point $\vec{r}$ is then computed by combining, or more particularly, performing a bilinear integration of the generalized bilinear kernel with the mask transmission function. The resulting image $I(\vec{r})$ can then be used to perform model-based optical proximity correction (MBOPC).

In a preferred embodiment of the present invention, the SOCS decomposition of the generalized bilinear kernel may be performed. First the image plane within the region of interest (ROI) integration domain is gridded. If possible, in accordance with the invention, the ROI integration domain is preferably folded according to the symmetry of the system. The generalized bilinear kernel (GBK) is computed and tabulated at the grid points of the image plane, in the folded ROI integration domain. In this preferred embodiment, the tabulated GBK values are remapped to a reduced basis, and then the eigenfunctions of the GBK are calculated in the reduced basis, and converted back to the original grid. If necessary, the dominant eigenfunctions may be iteratively refined against the tabulated GBK values, for example, as in the Lanczos method. Then, the convolutions of the dominant eigenfunctions with the possible mask polygon sectors are pre-computed.

According to yet another aspect of the present invention, the computation of the image includes the step of decomposing the mask transmission function into an appropriate set of the possible polygon sectors. Then, for each of the dominant eigenfunctions, a pre-image is computed by forming the coherent sum of the contributions from the pre-computed convolutions of the dominant eigenfunctions with the mask polygon sectors within the ROI. The pre-image is weighted, preferably by the eigenvalue of the eigenfunction, and in particular, more preferably by the square root of the eigenvalue. Alternatively, the weights may be determined empirically. Finally, the image $I(\vec{r})$ is formed from the incoherent sum of the weighted pre-images of all the dominant eigenfunctions.

The present invention has the advantage that non-scalar effects such as vector effects including tailored source polarization, lens birefringence, and resist stack polarization, as well as blur in the mask or resist, can be incorporated efficiently in image calculation.

The present invention provides the following advantages:

1. The avoidance of extremely large computational errors which can result from taking the derivatives of a function which already has been computed with rounding errors.

2. Reduction of the time complexity of the computation of the resist image to that of the computation of just the aerial image. In accordance with the present invention, a generalized bilinear kernel is formed that has the same or similar form as the bilinear kernel used to form the aerial image according to the SOCS approximation of the Hopkins model. In other words the invention reduces the complexity of the resist image computation to the complexity of obtaining just the aerial image, or by at least a factor on the order of 10.

3. Improved accuracy of the image due to the inclusion of non-scalar effects, including, but not limited to effects of the vector electric field, tailored source polarization, lens birefringence, defocus variations, resist stack and blur from the mask and the resist.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings, in which:

FIGS. 4–6 illustrate flowcharts of the method according to the present invention.

DETAILED DESCRIPTION

Figure 1:
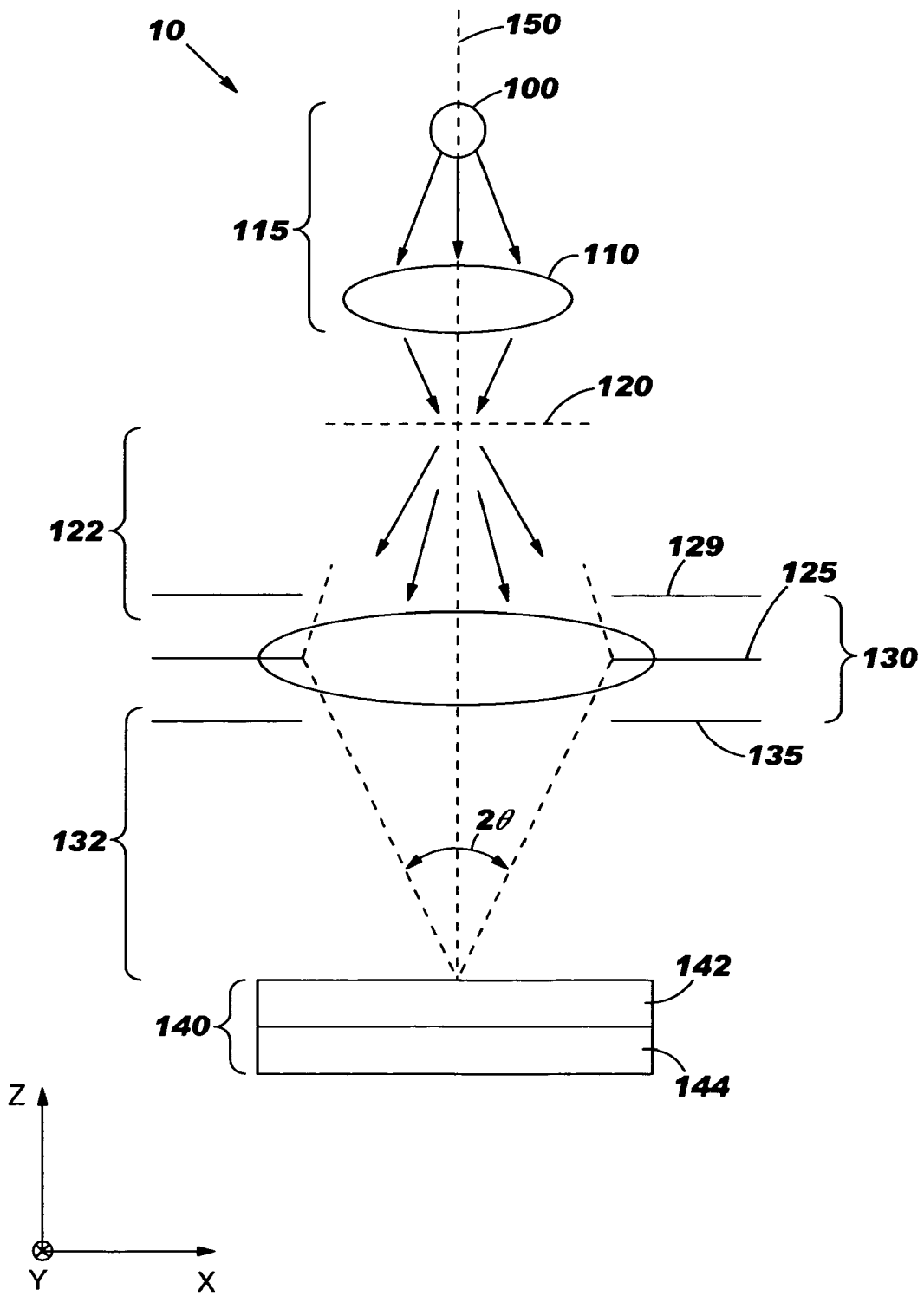
FIG. 1 illustrates a lithographic projection system.

In the following description, numerous specific details may be set forth to provide a thorough understanding of the present invention. However, it will be obvious to those skilled in the art that the present invention may be practiced without such specific details. In other instances, well-known features may have been shown in block diagram form in order not to obscure the present invention in unnecessary detail.

Refer now to the drawings wherein depicted elements are not necessarily shown to scale and wherein like or similar elements are designated by the same reference numeral through the several views.

FIG. 1 illustrates a schematic diagram of Kohler projection system 10 used in optical lithography. An energy source 100 provides actinic energy (actinic energy is that illumination energy that will drive the reaction in the resist), which may be projected through a condenser lens 110 to a patterned mask or reticle (120). Together, the source 100 and the condenser lens 110 may be referred to as the illumination source 115. The light diffracted from the mask 120 then passes through a projection lens 130 (having an entrance pupil 129 and an exit pupil 135), and is then projected onto a wafer 140, which typically includes a resist layer 142 and an underlying substrate 144. The resolution of the projection system 10 is related to the amount of light controlled by the lens aperture stop 125, as indicated by the maximum angle $\theta$ of the projected light relative to the optical axis 150 along the z direction, illustrated in FIG. 1, where $2\theta$ is the range of angles that converge from the lens 130 on to each image point. The numerical aperture of the projection system is given by NA=n sin $\theta$, where n is the index of refraction of the medium surrounding the lens (which is about 1 for air). For the present discussion, the region 122 between the mask 120 and the projection lens 130 is hereinafter referred to as the object space, and the region 132 between the projection lens 130 and the wafer 140 will be referred to hereinafter as the image space.

Figure 2:
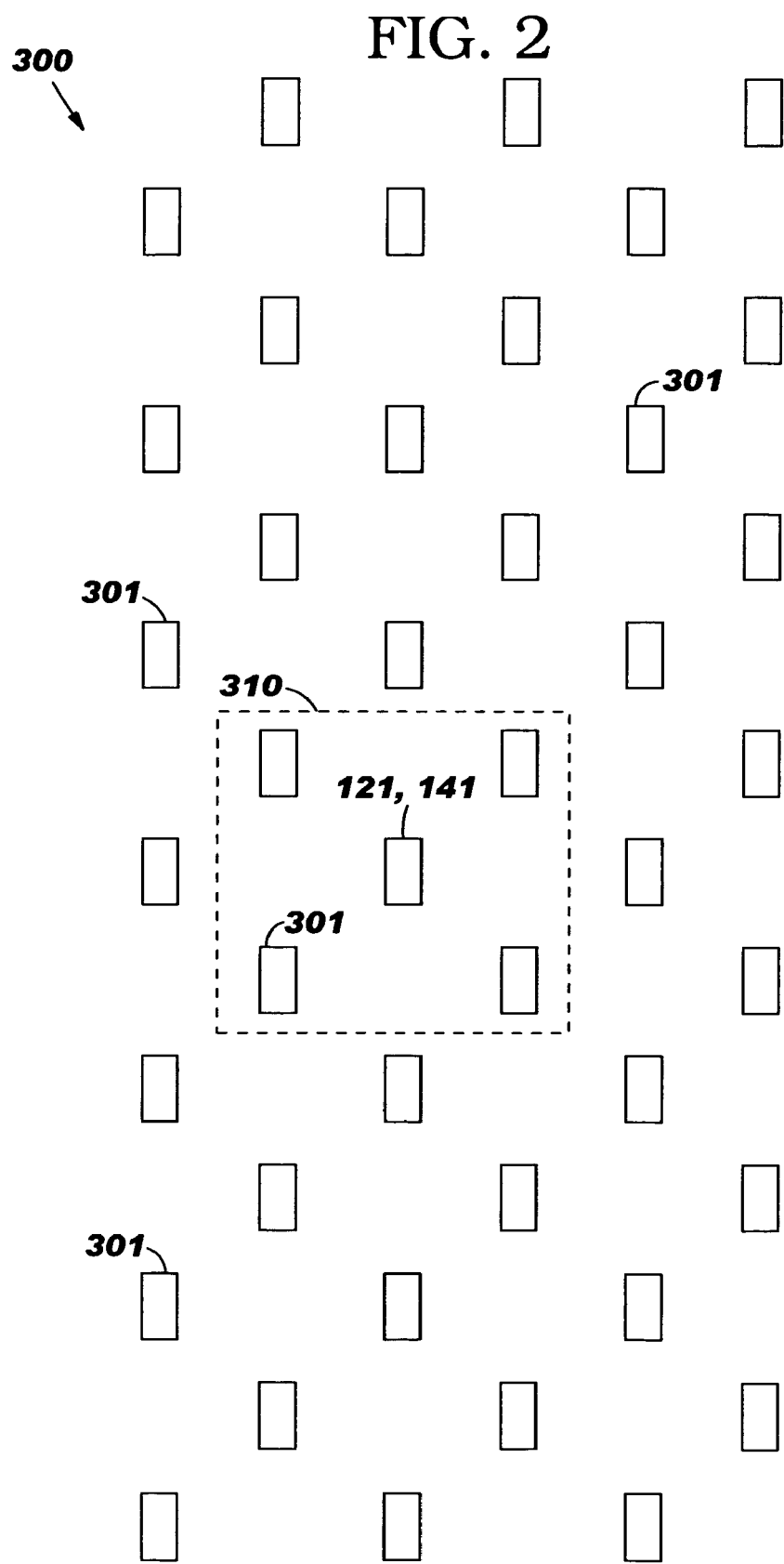
FIG. 2 illustrates a mask layout and a region of influence (ROI) according to the present invention.

Each image calculation from MBOPC programs typically involves only those mask shapes that are contained within a small region (the so-called Region Of Interest, or ROI) that is centered on the image point of interest $\vec{r}$. For example, FIG. 2 illustrates a mask layout 300 comprising mask polygons 301. The image point of interest $\vec{r}$ 141 has a corresponding point on the mask layout $\vec{r}'$, $\vec{r}''$ (indicated reference numeral 121). Only mask polygons 301 within a certain zone of influence from the image point is considered in the computation of the image intensity, which is referred to hereinafter as the "region of interest" or ROT 310. This ROT 310 region is only modestly larger than the lens resolution, e.g. the ROI 310 might have a radius of hugm (at 1× scale) for a lens used to print 90 nm features. When a particular ROI field is evaluated, one does not calculate image intensity at points near the ROI boundary. Usually, only the intensity at the center point 121 of the ROI 310 is evaluated; alternatively, as disclosed in K. Lai et al., "Improvement of performance in sector-based OPC engine utilizing efficient polygon pinning method and simultaneous computation of multiple sample points," (co-assigned U.S. patent application Ser. No. 10/694,473, filed on Oct. 27, 2003, the contents of which are hereby incorporated by reference in its entirety) the intensity may be evaluated at several interior points, so long as these points are far from the ROI boundary. Under this assumption, we can assume for purposes of discussion that periodic boundary conditions apply. However, this assumption need not be made during actual calculation of the sector tables.

Figure 3:
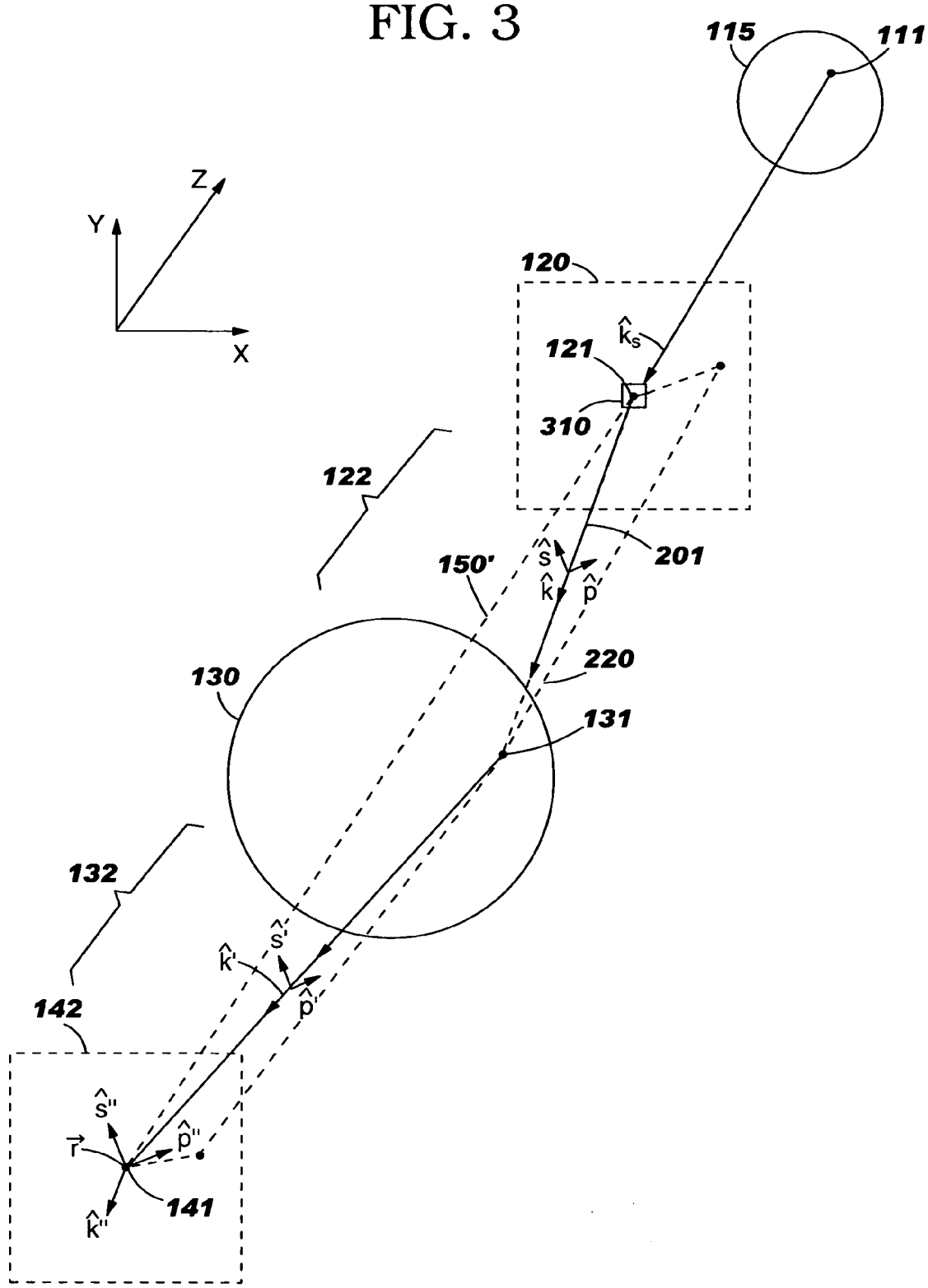
FIG. 3 illustrates the vector propagation of a ray through the projection system.

Suppose we then interpret the ROI 310 as the unit cell of a grating, where the size of the grating 300 is large compared to the ROI 310, but still microscopic on the scale of the projection lens 130. Referring to FIG. 3, thus, considering the coherent image component that arises during illumination from a single source point 111 (here the energy source 100 and condenser lens 110 in FIG. 1 are considered together as the illumination source 115), the beams which diffract from the ROI 310 will have a subtended width (not shown) in object space 122 that is quite small on scales characteristic of the projection lens 130. Each such beam is focused into the entrance pupil 129 under Kohler illumination. As the diffracted order propagates from the entrance pupil 129 to the exit pupil 135 and then to the image plane (e.g. at the wafer 140), the small width of the beams diffracted from the ROI 310 allows it to be treated it as a single ray being focused by the lens 130.

Vector and Polarization Effects

Referring to FIG. 3, consider how the various lithographic effects described above can be accounted for during propagation of a diffracted order, represented by ray 201 from a point 121 on the mask 120 through the projection lens 130 to a point $\vec{r}$ 141 on the image plane 142 (which is typically within the resist layer 142). A meridinal plane 220 can be defined as the plane containing the path of the ray 201 and the local optical axis 150' (which is the ray that passes through the center of the aperture stop 125, but passes locally through the mask point 121 and the focal point on the image plane $\vec{r}$ 141). Consider first the simple case in which the source 100 is either linear polarized or unpolarized, and where the projection lens 130 exhibits ideal, nonpolarizing behavior. Even with an ideal projection lens 130 and a source of fixed polarization and low illumination-NA, the polarization along a propagating ray 201 will undergo rotation of sorts, since transversality must be maintained as the ray changes direction within the projection lens 130. Since lithographic lenses are telecentric in both object and image spaces, we can consider the image point of interest $\vec{r}$ 141 to lie on the local optical axis 150' (taken to lie along z). Optionally, the effect of aberrations specific to a specific image location can be taken into account by applying the aberration in the aperture stop appropriate to the field location, as is known in the art.

For a ray propagating in a direction $\hat{\kappa}=(\alpha,\beta,\gamma=mt;epmrl;\sqrt{1-\alpha sup2reset-\beta sup2resetrlxmx})$, the polarization of the ray can be tracked against an $(s, p)$ basis, where the p component of the ray polarization lies within the meridional plane 220 and the s component of the ray polarization is orthogonal to the p *component, where*:

$$\hat{s} = \frac{-\hat{z} \times \hat{\kappa}}{|\hat{z} \times \hat{\kappa}|} \text{ in object space } 122; \quad \hat{p} = \hat{s} \times \hat{\kappa} \qquad \text{Equation 5}$$

$$\hat{s}' = \frac{+\hat{z} \times \hat{\kappa}'}{|\hat{z} \times \hat{\kappa}'|} \text{ in image space } 132; \text{ and } \hat{p}' = \hat{s}' \times \hat{\kappa}' \qquad \text{Equation 6}$$

$$\hat{s}'' = \frac{+\hat{z} \times \hat{\kappa}''}{|\hat{z} \times \hat{\kappa}''|} \text{ in the resist layer } 142, \quad \hat{p}'' = \hat{s}'' \times \hat{\kappa}'' \qquad \text{Equation 7}$$

where the ray directions in image space 132 ($\hat{\kappa}'$) and in the resist layer 142 ($\hat{\kappa}''$) are determined from the object space 122 direction ($\hat{\kappa}$) using the magnification (sine condition), and the resist index (Snell's law). Note that we have the identity $$\hat{s}=\hat{s}'=\hat{s}''$$ Equation 8 since the sign change between the $\hat{s}$ component of the ray polarization of Equation 5 and the $\hat{s}'$ component of Equation 6 simply represents the inversion of the ray direction by the lens 130 (i.e. the magnification is negative). Note also that a distinction is drawn between image space 132 and the resist layer 142. Although it is not required by the present invention, preferably, the propagation from mask to wafer is treated using polarization ray tracing, but propagation into the resist stack is treated using a conventional plane wave thin-film approach.

To make large-area lithographic simulations practical, it is customary to make simplifying assumptions about mask diffraction. This involves two approximations; first, the so-called thin mask approximation, and second, an assumption that the projection lens impulse response function (which arises from spatial invariance) is also invariant with respect to illumination direction. For the present invention it is necessary extend both approximations to the case of a polarized source. To some extent both approximations are improved at large reduction ratios, where propagation angles of collected orders are relatively small and mask features relatively large; however even at low mask-side NA both approximations can be invalidated by strong topographic effects in the patterned mask.

Vector Effects

At low mask-side NA there is no difficulty in representing the source polarization distribution by a 2D map which specifies the (2D) polarization direction of each source point. However, the reduction to 2D becomes somewhat arbitrary when mask-side NA is non-negligible. By convention we will refer to the coordinate directions for the source map as x' and y' (i.e. we take the optical axis to lie along z ). The illuminating direction will be specified by the (global) x and y direction cosines, while local x' and y' coordinate directions will be used to specify the illuminating polarization along each ray, for example by defining the local x' axis to be perpendicular to the plane 220 containing the ray and the global y axis (with the local y' axis then being perpendicular to the x' axis and the ray 201). The unit vectors along the x' and y' directions can be expressed as follows:

$$\hat{y}' = \frac{\hat{y} - (\hat{y} \cdot \hat{k}_S)\hat{k}_S}{|\hat{y} - (\hat{y} - \hat{k}_S)\hat{k}_S|}$$ Equation 9

$$\hat{x}' = \hat{y}' \times \hat{k}_S$$

where $\hat{x}, \hat{y}$ are the unit vectors of the global coordinate system, and $\hat{k}_s$ is the illumination direction.

Unpolarized or partially polarized sources are treated by independently superposing the system kernels calculated for independent polarized sources.

The assumption of spatial invariance (i.e. the assumption that the projection lens 130 can be characterized be a fixed lens impulse response function within each local imaging field) primarily involves the projection lens 130. However, to treat partially coherent illumination an associated assumption is conventionally made about mask diffraction, namely that mask diffraction can properly be treated by applying the same fixed lens impulse response function to the mask shapes even as the illuminating direction shifts from source point to source point (with the amplitude transmitted through the mask shapes changing only by the illumination tilt phase). The present treatment likewise requires that the projection lens exhibit a spatially invariant impulse response. It is not strictly necessary that this impulse response be invariant with respect to source direction, even for a single source polarization. However, the pre-calculation phase of the invention is significantly lengthened unless the impulse response obeys a constrained dependence on source direction, which is hereinafter referred to as a generalized source-invariance. The simplest such source-invariance model constitutes a natural extension of the assumption conventionally made in the scalar Hopkins treatment; the projection lens is found to be governed by two vector impulse response functions that are independent of illumination direction (except for a phase tilt), with each vector response corresponding to polarization along one of the two source polarization directions, x' or y'. Even though, at non-negligible mask-side NA, the polarization of the illuminating ray cannot really be completely invariant as ray direction is varied, since mask-side NA is reduced by a factor of at least 4, the polarization of the illuminating ray is almost invariant as ray direction is varied.

Efficient pre-calculation is also possible with more complex models that do not require approximate source invariance. For example, the source 115 can be divided into independent regions (e.g. the poles of a quadrupole) that are each governed by a pair of source impulse response functions. In accordance with the present invention, efficient integration to determine a generalized bilinear kernel does not require full directional source invariance within the region; only that the response be a sum of separable functions of the illumination and collection directions (i.e. diffraction directions).

The present invention uses the thin mask approximation, as known in the art, in that the amplitude of the diffracted light is calculated as the Fourier transform of the mask patterns (or, in some embodiments, as the Fourier transform of a blurred rendition of the mask patterns; in general the function must be linear). It has been shown that the thin-mask framework can be extended to accommodate mask topography effects by replacing the true mask patterns with effective patterns whose Fourier transform more closely reproduces the true diffraction spectrum. A simple approach along these lines is to bias each edge with a slightly increased chrome width.

In a preferred embodiment of the present invention, consider the case of an ideal lens for a simple model of mask diffraction. Consider the on-axis source point to be polarized along a direction $\vec{E}_0$ that has no z component. The $\vec{E}_0$ direction will usually have a component perpendicular to the meridional plane 220 of a given ray 201; we identify the projection of $\vec{E}_0$ perpendicular to the meridional plane 220 as the s component of the ray polarization, and assume initially that the amplitude of the $\hat{s}$ component is maintained in propagating through the lens 130 (this is true of an ideal lens; the general case will be considered later). In our initial simple scenario the s amplitude of the electric field is taken to be equal to this projection factor multiplied by the usual Fourier component of the mask diffraction pattern, which (due to relatively low NA) is calculated on a scalar basis (as is done in the prior art). The s component of the electric field is the given by, for an ideal lens:

$$E_S = -A(\hat{\kappa}) \frac{\vec{E}_0 \cdot (\hat{z} \times \hat{\kappa})}{|\hat{z} \times \hat{\kappa}|} \qquad \text{Equation 10}$$

where $A(\hat{\kappa})$ is the scalar order-amplitude, given in Equation 13 below. When the s component is mathematically subtracted from $\vec{E}_0$, the remainder is not transverse to the ray 220, and therefore does not represent a true p polarization component. Since we are treating diffraction from the mask 120 in an approximate way (given the relatively low-NA), we will initially assume that the magnitude of the p component can be calculated by finding the magnitude of this in-plane $\vec{E}_0$ component (multiplied by the appropriate scalar diffraction order amplitude $A(\hat{\kappa})$). The direction of this p component is of course taken to lie along the transverse direction $\hat{p}$. We take the sign of the p component to be $\text{sign}(\hat{p} \cdot \vec{E}_0)$.

After some algebra, we find that the p component is then given by:

$$E_P \hat{p} \equiv \left(\text{sign}(\hat{p} \cdot \vec{E}_0)|\vec{E}_0 - (\vec{E}_0 \cdot \hat{s})\hat{s}|\right) A(\hat{\kappa}) \hat{p} \qquad \text{Equation 11}$$
$$= \left(-\frac{\vec{E}_0 \cdot \hat{\kappa}}{|\hat{z} \times \hat{\kappa}|}\right) A(\hat{\kappa}) \hat{p},$$

where we have used $\hat{z} \cdot \vec{E}_0 = 0$. Note that Equation 11 will obey the identity $$\frac{\vec{E}_0 \cdot \hat{\kappa}}{|\hat{z} \times \hat{\kappa}|} = -\frac{\vec{E}_0 \cdot \hat{\kappa}'}{|\hat{z} \times \hat{\kappa}'|} = -\frac{\vec{E}_0 \cdot \hat{\kappa}''}{|\hat{z} \times \hat{\kappa}''|}. \qquad \text{Equation 12}$$

since the x and y components of $\hat{\kappa}$ (the direction of propagation of the ray 220 in object space 122) and $\hat{\kappa}'$ (the direction of propagation of the ray 220 in image space 132) only change in the ratio of the magnification, which cancels between numerator and denominator.

In our model the electric field strength along the ray 220 will also be multiplied by the scalar diffraction efficiency $A(\hat{\kappa}, \hat{\kappa}_s)$ of the mask 120 in the ray propagation direction $\hat{\kappa}$, which for unit illuminating intensity from source direction $\hat{\kappa}_s$ is given by:

$$A(\hat{\kappa}, \hat{\kappa}_s) = \iint d\vec{r}\, m(\vec{r}) e^{i(\vec{\kappa}_s + \vec{\kappa}) \cdot \vec{r}}, \qquad \text{Equation 13}$$

where $m(\vec{r})$ is the mask transmittance function.

In an ideal lens the s and p polarizations will not mix, and ray intensity will not be absorbed in the lens. As discussed-above, we can identify the ray 220 with a single order diffracted from the mask 120, truncated with a cross-section bounded by e.g. the ROI 310 in the mask plane (or some multiple thereof, taken here to be 1). The cross-section area subtended in the wafer plane is equal to $\text{ROI} \times M^2$ (where M is the magnification of the lithographic system, and typically $M=-0.25$). However, this area is only subtended obliquely, i.e. it is foreshortened as seen from the ray direction, and the perpendicular cross-section area is therefore reduced by a factor $\gamma'$, where $\gamma'$ denotes the z component of $\hat{\kappa}'$, the direction of propagation in image space 132. This concentration causes an increase in the electric field strength. In an ideal lens the electric field along the ray (diffraction order) therefore changes by a ratio $M\sqrt{\gamma/\gamma'}$ between object and image. We suppress the constant factor M for simplicity, and define the so-called obliquity factor as:

$$O(\hat{\kappa}') \equiv \sqrt{\frac{\gamma}{\gamma'}}.$$

We should also note that it is customary to describe mask-plane quantities in so-called "1×" wafer-scale coordinates, often without explicitly saying so. We will follow this custom below, referring to both the mask-scale and wafer-scale integration domains as "the ROI".

The s component of the ray 220 is transverse to the resist plane of incidence (the resist plane of incidence is the plane containing the ray and the normal to the resist surface), so the s vector component propagates into the resist 142 with a transmittance $\tau_s(\Delta z_r)$, where $\tau_s(\Delta z_r)$ is the coefficient for s transmission through the wafer film stack 142 to a depth $\Delta z_r$. Using standard thin film methods one can also calculate a transmission coefficient $\tau_p(\Delta z_r)$ for the p component. The transmittance coefficients calculated by these standard methods provide the tangential component of the field (i.e. the component parallel to the interface of the resist stack 142), so we define $$\tilde{\tau}_p(\Delta z_r) \equiv \frac{\gamma'}{\gamma''} \tau_p(\Delta z_r) \qquad \text{Equation 15}$$

as the transmission coefficient for the magnitude of the p amplitude. In the equations below we will suppress the $\Delta z$ dependence for brevity.

If the bottom surface of the resist layer 142 is anti reflected, the electric field $\vec{E}''$ in the resist 142 will then be proportional to the quantity $\vec{Q}(\hat{\kappa})$, that is:

$$\vec{E}''(\hat{\kappa}'') = A(\hat{\kappa}''; \hat{\kappa}_s) O(\hat{\kappa}') \vec{Q}''(\hat{\kappa}''). \qquad \text{Equation 16}$$

where $\vec{Q}(\hat{\kappa})$ is defined as $$\vec{Q}(\hat{\kappa}) = \tau_s E_s \hat{s}'' + \tilde{\tau}_p E_p \hat{p}''. \qquad \text{Equation 17}$$

Note that the electric field in image space is similarly given by:

$$\vec{E}'(\hat{\kappa}') = A(\hat{\kappa}'; \hat{\kappa}_s) O(\hat{\kappa}') \vec{Q}'(\hat{\kappa}') \qquad \text{Equation 18}$$

where the obliquity factor $O(\hat{\kappa}')$ in both the resist (Equation 16) and image space (Equation 18) is given by the same factor given by Equation 14.

By making use of Equation 5, Equation 6, Equation 7, Equation 8, Equation 10, Equation 11, Equation 12 and Equation 15, we find after some algebra that inside the resist layer, with an index-matched substrate:

$$\vec{Q}(\hat{\kappa}) = \tau_S \vec{E}_0 - (\vec{E}_0 \cdot \vec{k}'') \left[ \tilde{\tau}_P \hat{z} + \frac{(\tau_S - \gamma'' \tilde{\tau}_p)}{k''^2} \vec{k}'' \right],$$  Equation 19 where $\vec{k}''$ is the projection of $\hat{\kappa}''$ transverse to the local optical axis within the resist stack 142:

$$\vec{k}'' = \hat{\kappa}'' - (\hat{\kappa}'' \cdot \hat{z})\hat{z} = \{\alpha, \beta, 0\},$$  Equation 20 with the last form representing a vector of Cartesian components. Note that the first term $\tau_s \vec{E}_0$ on the right of Equation 19 is essentially the standard, near-scalar result that obtains at low NA, while the remaining terms can be thought of as vector corrections. However, the $\tau_s$ factor appearing in the first term of Equation 19 can have a significant angle dependence at high NA. The term in square brackets Equation 19 is of order unity as $\vec{k}'' \to 0$ because $\tau_s \to \tilde{\tau}_p$, $\gamma'' \to 1$ at normal incidence; we therefore have $\vec{Q} \to \tau_s \vec{E}_0$ in the low-NA limit, as expected.

The beam cone angle is more pronounced in air than in resist, so the image in air (the so-called aerial image) shows larger departures from scalar behavior at high NA than does the resist image. Thus, one must be cautious in approximating the resist image with the aerial image at NA's where vector interference effects are important. Bearing this caveat in mind, we note that Equation 19 provides as a special case a simple expression for the electric field $\vec{E}'$ along rays in the aerial image space 132:

$$\vec{Q}(\hat{\kappa}) = \vec{E}_0 - \frac{(\vec{E}_0 \cdot \hat{\kappa}')}{1 + \gamma'}[\vec{k}' + \gamma \hat{z}].$$

$\vec{Q}''(\hat{\kappa})$ of Equation 19 can be generalized to include the case of a stack of films 142 on the 144 wafer, e.g. antireflection layers above and below the resist, and/or other process films. Transfer into a general film stack 142 is not governed by a single transmittance $\tau$; in addition to the transmitted down-traveling wave having amplitude u, the resist layer 142 will in general also contain an up-traveling wave having amplitude v that has reflected from the substrate 144. To solve for these amplitudes we divide the film stack 142 into an upper and lower substack, separated by the depth-plane within the resist at which we want to calculate the image. Standard thin-film methods can be used to calculate the up-traveling and down-traveling amplitudes, v,u, respectively; separate calculations must be made for the up and down-traveling s components ($v_s$ and $u_s$, respectively) and the p components ($v_p$ and $u_p$, respectively). Thin-film methods conventionally provide transfer coefficients for the tangential field components, since the equations that are solved for these coefficients express the continuity of tangential components across interfaces. Our Equation 26 below recovers the full electric field from these components.

To solve for the fields, we first calculate the standard thin-film characteristic matrix for each layer, defined as $$\begin{pmatrix} \cos\beta & -\frac{i}{Y}\sin\beta \\ -iY\sin\beta & \cos\beta \end{pmatrix},$$  Equation 22 where $\beta \equiv 2\pi n d \cos\theta / \lambda$, n is the film index of refraction, and d is the film thickness of the layer. Y is the layer admittance, defined as $Y \equiv n \cos\theta$ for s polarization, and $Y = n/\cos\theta$ for p polarization, with $\theta$ the ray angle inside the film (calculated from Snell's law). The film matrices are multiplied together to form substack matrices $M_1$ for the upper substack and $M_2$ for the lower, and full stack matrix $M_{Tot} = M_1 M_2$. The following four linear equations are then solved for u and v (eliminating the supplementary unknowns $\rho_{Tot}$ and $\tau_{Tot}$):

$$\begin{pmatrix} 1 + \rho_{Tot} \\ Y_{inc}(1 - \rho_{Tot}) \end{pmatrix} = M_{Tot} \begin{pmatrix} 1 \\ Y_{subs} \end{pmatrix} \tau_{Tot},$$  Equation 23

$$\begin{pmatrix} u + v \\ Y_{resist}(u - v) \end{pmatrix} = M_2 \begin{pmatrix} 1 \\ Y_{sibs} \end{pmatrix} \tau_{Tot},$$

repeating this procedure for s and p polarizations. The field inside the resist 142 is then obtained from:

$$\vec{Q}(\vec{k}'') = \underbrace{(u_S + v_S)\vec{E}_0}_{\text{Scalar term}} - \frac{\vec{E}_0 \cdot \vec{k}''}{k''^2}[(u_S + v_S)\vec{k}'' + \tilde{u}_p(\hat{z}k''^2 - \gamma''\vec{k}) - \tilde{v}_p(\hat{z}k''^2 + \gamma''\vec{k}'')],$$  Equation 24 where $\tilde{u}$ is defined as $\tilde{u} \equiv \gamma' u/\gamma''$, and similarly for v.

In the case of a non-ideal lens, the electric field in image space can be determined by polarization raytracing, as known in the art. The relationship between image-space field $\vec{E}'$ and object-space field $\vec{E}$ can be represented as multiplication by a Jones matrix J:

$$\{E_s', E_p'\} = J(\vec{k}') \cdot \{E_s, E_p\}$$  Equation 25 where the Jones matrix J may be used to include birefringence of the lens. Equation 25 can then be employed in the following generalized version of Equation 24:

$$\vec{Q}(\vec{k}') = (v_s + u_s)[\hat{z} \times \hat{k}']E_s' + [\tilde{v}_p(\hat{k}'\gamma'' + \hat{z}k'') + \tilde{u}_p(\hat{k}'\gamma'' - \hat{z}k'')]E_p'.$$  Equation 26

Equation 25 and Equation 26 assume that matrix J is calculated using the s, p basis of Equation 5, Equation 6 and Equation 7. Thus, the electric field $\vec{E}'$ in image space obtained using $\vec{Q}(\vec{k}')$ of Equation 26 includes the vector effects of the film stack.

The s component of the electric field $E_s$ (of Equation 10) and p component of the electric field $E_p$ (of Equation 11) are written in terms of a single coherent illuminating polarization $\vec{E}_0$. Unpolarized illumination can be handled as an incoherent sum of coherent contributions from orthogonal initial choices of $\vec{E}_0$, as will be discussed further below.

Customized Source Polarization

Another important generalization is that of a source having customized or tailored polarization. For example, as NA approaches or exceeds 1, the image quality of certain low-k1 features can be enhanced by polarizing off-axis illumination in a tangential direction (i.e. in a direction perpendicular to the tilted plane of incidence). Formally, such customized polarization distributions can be handled by making $\vec{E}_0$ (and therefore $\vec{Q}$) functions of the projected illuminating direction $\vec{k}_s$, which is defined by analogy with Equation 19 as $$\vec{k}_s = \hat{\kappa}_s - (\hat{\kappa}_s \cdot \hat{z})\hat{z} = \{\alpha_s, \beta_s, 0\}. \qquad \text{Equation 27}$$

This also allows us to handle the polarization of light diffracted by the mask in a more general manner.

Vector Image Based on a Generalized Bilinear Kernel

In accordance with the present invention, we now obtain an expression for the overall image $I(\vec{r})$ at a point $\vec{r}$ in the resist 142 that comprises a generalized bilinear kernel. To do so, we calculate the total electric field vector at each position $\vec{r}$ in the resist 142 (from each source point and from each independent illumination polarization), then calculate $|\vec{E}|^2$, and then sum over all source points $\sigma$ and all independent illumination polarizations $\vec{k}_s$. (The sum over independent source polarizations, ranging from m=1 to m=$m_{Max}$, with $m_{Max}$ typically equal to 1 or 2, allows us to account for unpolarized or partially polarized illumination.) We obtain:

$$I(\vec{r}) = \sum_{m=1}^{m_{Max}} \int\!\!\int_\sigma d^2\vec{k}_S S(\vec{k}_S) \vec{E} \cdot \vec{E}^* \qquad \text{Equation 28}$$

$$= \sum_{m=1}^{m_{Max}} \int\!\!\int_\sigma d^2\vec{k}_S S(\vec{k}_S)$$

$$\left(\int\!\!\int_{NA} d^2\vec{k}_1'' A(\vec{k}_1'', \vec{k}_S)\right.$$

$$\left. P(\vec{k}_1'')O(\vec{k}_1'')\vec{Q}_m(\vec{k}_1''; \vec{k}_S)e^{i\vec{k}_1'' \cdot \vec{r}}\right) \cdot$$

$$\left(\int\!\!\int_{NA} d^2\vec{k}_2'' A(\vec{k}_2'', \vec{k}_S)\right.$$

$$\left. P(\vec{k}_2'')O(\vec{k}_2'')\vec{Q}_m(\vec{k}_2''; \vec{k}_S)e^{i\vec{k}_2'' \cdot \vec{r}}\right)^*$$

$$= \sum_{m=1}^{m_{Max}} \int\!\!\int_{ROI} d^2\vec{r}' \int\!\!\int_{ROI} d^2\vec{r}'' m(\vec{r}'/R)m^*(\vec{r}''/R) \times$$

$$\int\!\!\int_\sigma d^2\vec{k}_S S(\vec{k}_S)e^{i\vec{k}_S \cdot (\vec{r}' - \vec{r}'')} \times$$

$$\left(\int\!\!\int_{NA} d^2\vec{k}_1'' P(\vec{k}_1'')\right.$$

$$\left. O(\vec{k}_1'')\vec{Q}_m(\vec{k}_1''; \vec{k}_S)e^{i\vec{k}_1'' \cdot (\vec{r} - \vec{r}')}\right) \cdot$$

$$\left(\int\!\!\int_{NA} d^2\vec{k}_2'' P(\vec{k}_2'')O(\vec{k}_2'')\vec{Q}_m(\vec{k}_2''; \vec{k}_S)e^{i\vec{k}_2'' \cdot (\vec{r} - \vec{r}'')}\right)^*$$

$$= \int\!\!\int_{ROI} d^2\vec{r}' \int\!\!\int_{ROI} d^2\vec{r}'' m(\vec{r}'/R)m^*(\vec{r}''/R)$$

$$\int\!\!\int_\sigma d^2\vec{k}_S S(\vec{k}_S)$$

$$e^{i\vec{k}_S \cdot (\vec{r}' - \vec{r}'')} \sum_{m=1}^{m_{Max}} \vec{h}_m(\vec{r} - \vec{r}'; \vec{k}_S) \cdot \vec{h}_m^*(\vec{r} - \vec{r}''; \vec{k}_S)$$

$$= \int\!\!\int_{ROI} d^2\vec{r}' \int\!\!\int_{ROI} d^2\vec{r}'' m(\vec{r} - \vec{r}')m^*(\vec{r} - \vec{r}'')$$

$$\int\!\!\int_\sigma d^2\vec{k}_S S(\vec{k}_S)e^{i\vec{k}_S \cdot (\vec{r}' - \vec{r}'')}$$

$$\sum_{m=1}^{m_{Max}} \vec{h}_m(\vec{r}'; \vec{k}_S) \cdot \vec{h}_m^*(\vec{r}''; \vec{k}_S).$$

As discussed further below, in accordance with the present invention, the image $I(\vec{r})$ of Equation 28 is now expressed in terms of a generalized bilinear kernel, $V(\vec{r}', \vec{r}'')$, given by:

$$V(\vec{r}', \vec{r}'') \equiv \qquad \text{Equation 29}$$

$$\int\!\!\int_\sigma d^2\vec{k}_S S(\vec{k}_S)e^{i\vec{k}_S \cdot (\vec{r}' - \vec{r}'')} \sum_{m=1}^{m_{Max}} \vec{h}_m(\vec{r}'; \vec{k}_S) \cdot \vec{h}_m^*(\vec{r}''; \vec{k}_S),$$

which is dependent only on the source function $S(\vec{k}_s)$ and the impulse response function of the lens $\vec{h}$ (which may also include information about the resist stack), but is independent of the mask transmittance function $m(\vec{r})$.

In the last line of Equation 28 we have written the mask patterns $m(\vec{r})$ as if the reduction ratio R=1/Abs(M) were 1, following the common practice of describing masks in "1×dimensions". The integrals in Equation 28 should technically extend to infinity, but in practice they are restricted for computational reasons to a domain (such as ROI 310) modestly larger than the lens resolution, e.g. ±~4λ/NA. $P(\vec{k})$ represents the aberrated scalar pupil of the system, which may include defocus aberration. We have also introduced the symbol $\vec{h}$ to represent the electric field distribution in the image plane due to illuminating the projection, and is referred to as a lens vector impulse response, defined as $$\vec{h}_m(\vec{r} - \vec{r}'; \vec{k}_S) \equiv \qquad \text{Equation 30}$$

$$\int\!\!\int_{NA} d^2\vec{k}'' P(\vec{k}'')O(\vec{k}'')\vec{Q}_m(\vec{k}''; \vec{k}_S)e^{i\vec{k}'' \cdot (\vec{r} - \vec{r}')},$$

where $\vec{h}_m$ is the projection impulse response for a given source polarization m, which may also include lens birefringence, and may also include defocus aberration corresponding to a defocus position different from zero. $\vec{h}_m$ does not include the effect of limited resist resolution, but in general includes the effect of multiple reflections within the resist stack. However, if we use the aerial image field $\vec{Q}(\vec{k})$ (as in Equation 21) instead of the more general expression for the image field of Equation 26, then the projection impulse response function $\vec{h}_m$ of Equation 30 provides the aerial image impulse response of the lens without resist effects. Moreover, if we retain only the leading term in Equation 21, $\vec{E}_0$, we recover the scalar aerial image impulse response in Equation 30 rather than a generalized impulse response that includes vector interference, resist film stack, lens birefringence, customized source polarization, and varying partial degree of polarization in the source.

It should be noted that $\vec{Q}(\vec{k})$ of Equation 24 or Equation 26 only provide the field at a particular depth in the resist. This is consistent with the common practice of applying OPC to an image calculated within a single fixed image plane; however, in many cases it may be preferable to base OPC on the exposing image as averaged through the depth of the resist. This depth average can be approximated by an average over several planes, spaced by e.g. $\Delta z = 0.15\lambda/NA^2$. (One can average over lens focus in a similar way, for example to account for variation in positioning the wafer against the image beam; some of this variation will be truly cumulative in modern scanned lithography tools, since it is incurred when the wafer is scanned through the imaging field.) If the total number of planes is W, then using w as an index to denote the particular $\vec{Q}$ value obtained for each resist plane (from Equation 24 or Equation 26), the bilinear terms appearing in the expression for the image intensity $I(\vec{r})$ of Equation 28 are:

$$\vec{h}_m(\vec{r}';\vec{k}_S) \cdot \vec{h}_m^*(\vec{r}'';\vec{k}_S) \Rightarrow \frac{1}{W} \iint_{NA} d^2\vec{k}_1'' P(\vec{k}_1'') O(\vec{k}_1'') e^{i\vec{k}_1'' \cdot \vec{r}'} \iint_{NA}$$

$$d^2\vec{k}_2'' P(\vec{k}_2'') O(\vec{k}_2'') e^{i\vec{k}_2'' \cdot \vec{r}''} \sum_{w=1}^{W} \vec{Q}_{m,w}(\vec{k}_1'';\vec{k}_S) \cdot \vec{Q}_{m,w}^*(\vec{k}_2'';\vec{k}_S) \quad \text{Equation 31}$$

which provide the image in resist averaged over the depth of the resist. Though Equation 31 requires that the field be calculated in multiple planes, the actual use of depth-averaged images entails no additional computation once this pre-computation is completed (as long as the same total number of kernels is used). Note also that only a single sum over w should be made when $\vec{h}$ appears pairwise in bilinear terms; each copy of $\vec{h}$ or $\vec{Q}$ is indexed with the same value of w.

For simplicity we denote the inner integrals in the expression for image intensity $I(\vec{r})$ of Equation 28 with the symbol V, which is a 4D function in the x,y components of $\vec{r}'$ and $\vec{r}''$, so that the image intensity $I(\vec{r})$ of Equation 28, in accordance with the present invention, becomes a double convolution over the mask patterns:

$$I(\vec{r}) = \iint_{ROI} d^2\vec{r}' \iint_{ROI} d^2\vec{r}'' V(\vec{r}',\vec{r}'') m(\vec{r}-\vec{r}') \quad \text{Equation 32}$$

$$m^*(\vec{r}-\vec{r}''),$$

where $$V(\vec{r}',\vec{r}'') \equiv \iint_\sigma d^2\vec{k}_S S(\vec{k}_S) e^{i\vec{k}_S \cdot (\vec{r}'-\vec{r}'')} \quad \text{Equation 33}$$

$$\sum_{m=1}^{m_{Max}} \vec{h}_m(\vec{r}';\vec{k}_S) \cdot \vec{h}_m^*(\vec{r}'';\vec{k}_S),$$

which, in accordance with the present invention, is a generalized bilinear kernel that is independent of the mask transmission function. Thus, in accordance with the present invention, the image intensity $I(\vec{r})$ of Equation 32 can be viewed as a generalization of the scalar Hopkins integral, but which additionally includes the effects of vector diffraction, resist film stack, and tailored source polarization. In addition, according to the present invention, this leads to a generalization of the SOCS method, which reduces the 4D Hopkins integral to a sum of squared 2D convolutions. Additionally, if the polygonal shapes of IC mask patterns are exploited, for example, as described by K. Lai et al. (in co-assigned U.S. patent application Ser. No. 10/694,466, filed on Oct. 27, 2003, the contents of which are hereby incorporated by reference in its entirety), then the convolution integrals over mask patterns can be calculated rapidly. Note that if the index of refraction of the resist is equal to 1, then $I(\vec{r})$ of Equation 32 is equivalent to the aerial image.

Mask Blur

However, the mask shapes $m(\vec{r})$ will not be exactly polygonal, since mask-making tools have finite resolution, causing corner rounding in the pattern. Roughly speaking, we may approximate this loss in mask definition by convolution with a mask blur function $b(\vec{r})$. If we denote the blurred mask patterns as m', we have in this approximation the following replacement for the image intensity $I(\vec{r})$ of Equation 32 that includes mask blur:

$$I(\vec{r}) = \int\int d^2\vec{r}' d^2\vec{r}'' V(\vec{r}',\vec{r}'') m'(\vec{r}-\vec{r}') m'^*(\vec{r}-\vec{r}''), \quad \text{Equation 34}$$

where $$m'(\vec{r}) \equiv \int\int d^2\vec{R} \, b(\vec{R}) m(\vec{r}-\vec{R}). \quad \text{Equation 35}$$

Unfortunately, the image intensity $I(\vec{r})$ including mask blur as in Equation 34 requires considerably more computation to evaluate than Equation 32, since the functions m' are continuously varying functions, rather than binary polygons.

However, we can generalize the intensity $I(\vec{r})$ of Equation 28 to include the effect of the mask blur function $b(\vec{r})$ as follows:

Substituting the mask shapes m of Equation 35 into the intensity $I(\vec{r})$ of Equation 34 gives:

$$I(\vec{r}) = \int\int\int\int d^2\vec{r}' d^2\vec{r}'' d^2\vec{R}' d^2\vec{R}'' V(\vec{r}',\vec{r}'') b(\vec{R}') b(\vec{R}'') m(\vec{r}-\vec{r}'-\vec{R}') m^*(\vec{r}-\vec{r}''-\vec{R}''). \quad \text{Equation 3}$$

Making the change of variables $$\vec{s}' \equiv \frac{1}{2}(\vec{r}' - \vec{R}'),\ \kappa' \equiv \vec{r}' + \vec{R}',\ d^2\vec{r}'d^2\vec{R}' = d^2\kappa' d^2\vec{s}',$$ Equation 37

$$\vec{s}'' \equiv \frac{1}{2}(\vec{r}'' - \vec{R}''),\ \kappa'' \equiv \vec{r}'' + \vec{R}'',$$

$$d^2\vec{r}''d^2\vec{R}'' = d^2\kappa''d^2\vec{s}'',\ \text{gives}$$

$$I(\vec{r}) = \int\int d^2\kappa' d^2\kappa'' V'(\kappa',\kappa'')m(\vec{r}-\kappa')m^*(\vec{r}-\kappa''),$$ Equation 38 where $$V'(\kappa',\kappa'') \equiv \int\int d^2\vec{s}' d^2\vec{s}''$$ Equation 39

$$V\left(\frac{\kappa'}{2}+\vec{s}',\frac{\kappa''}{2}+\vec{s}''\right) b\left(\frac{\kappa'}{2}-\vec{s}'\right) b\left(\frac{\kappa''}{2}-\vec{s}''\right)$$

where $$V\left(\frac{\kappa'}{2}+\vec{s}',\frac{\kappa''}{2}+\vec{s}''\right)$$

is the generalized bilinear kernel without the mask (see Equation 33). It is convenient to modify Equation 38 and Equation 39 with additional changes of variables, to obtain $$I(\vec{r}) = \int\int d^2\vec{r}' d^2\vec{r}'' V''(\vec{r}',\vec{r}'')m(\vec{r}-\vec{r}')m^*(\vec{r}-\vec{r}''),$$ Equation 40 with $$V'(\vec{r}',\vec{r}'') = \int\int d^2\vec{K}' d^2\vec{K}'' V(\vec{r}',\vec{r}'')$$ Equation 41

$$b(\vec{r}'-\vec{K}')b(\vec{r}''-\vec{K}'')$$

$$= \int\int d^2\vec{K}' d^2\vec{K}''$$

$$\int\int_\sigma d^2\vec{k}_S S(\vec{k}_S) e^{i\vec{k}''\cdot(\vec{K}'-\vec{K}'')}$$

$$b(\vec{r}'-\vec{K}')b(\vec{r}''-\vec{K}'')$$

$$\sum_{m=1}^{m_{Max}} \vec{h}_m(\vec{K}';\vec{k}_S)\cdot \vec{h}_m^*(\vec{K}'';\vec{k}_S).$$

Note that Equation 40 images the nominal polygonal mask patterns $m(\vec{r})$, rather than the blurred mask $m'(\vec{r})$ that is used in Equation 34.

Thus, in accordance with the present invention, the image $I(\vec{r})$ of Equation 40 includes the generalized bilinear kernel $V'(\vec{r}',\vec{r}'')$ of Equation 41, which includes blurring from mask fabrication, and accounts for blurring imposed by the optics (and by multiple reflections within the film stack) using a generalized vector model (also accounting for the contrast loss at high-NA that can occur with interfering vector fields).

However, resist blur may occur due to the finite resolution of the resist. As discussed above, this resist blurring can be accounted for by convolution of the optical image with a blur function, or equivalently by attenuation of the image spatial frequency content by a modulation transfer function. However, such methods, which involve direct convolution of the resist blur function with the image, are inefficient.

Resist Blur

In accordance with the present invention, the effects of resist blur can be included efficiently in the image, for example by determining an effective resist blur function from the measured resist modulation transfer function (MTF) by 2D Fourier transform (Hankel transform):

$$g_{2D}(\vec{r}) = g_{2D}(|\vec{r}|) = 2\pi\int_0^\infty d\nu\nu J_0(2\pi|\vec{r}|\nu)MTF(\nu),$$ Equation 42 where $g_{2D}(\vec{r})$ is the exposure response of the resist, and more particularly, the exposure response at a plane in the resist stack structure, and $J_0$ is a Bessel function. The exposure response of the resist is typically measured, or estimated, or provided by the resist manufacturer. The lithographically relevant image is determined from the optical image according to:

$$I_{Litho}(\vec{r}) = \int\int_{ROI} d^2\vec{R}\, I(\vec{R})g_{2D}(\vec{r}-\vec{R}).$$ Equation 43

Unfortunately, the optical image $I(\vec{R})$ is continuously varying, making Equation 43 difficult to integrate in the rapid fashion required for OPC. However, in accordance with the present invention, we can account for resist resolution using a modified generalized bilinear imaging kernel V'' that adds resist blur to the extended list of phenomena included in Equation 41:

$$I_{Litho}(\vec{r}) = \int\int d^2\vec{r}' d^2\vec{r}'' V''(\vec{r}',\vec{r}'')m(\vec{r}-\vec{r}')m^*(\vec{r}-\vec{r}''),$$ Equation 44 where the modified generalized bilinear kernel $V''(\vec{r}',\vec{r}'')$ in accordance with the present invention is $$V'(\vec{r}',\vec{r}'') = \frac{1}{W}\int\int d^2\vec{K}' d^2\vec{K}''$$ Equation 45

$$\int\int_\sigma d^2\vec{k}_S S(\vec{k}_S) e^{i\vec{k}''\cdot(\vec{K}'-\vec{K}'')}\times$$

$$\sum_{w=1}^{W}\sum_{m=1}^{m_{Max}} \vec{h}_{m,w}(\vec{K}';\vec{k}_S)\cdot \vec{h}_{m,w}^*(\vec{K}'';\vec{k}_S)$$

$$\int\int_{ROI} d^2\vec{R}\, g_{2D}(|\vec{R}|)$$

$$b(\vec{r}'+\vec{R}-\vec{K}')b(\vec{r}''+\vec{R}-\vec{K}'')$$

which includes resist blur averaged over depth of the resist stack and/or a range of focus positions. The generalized bilinear kernel V'' includes a projection impulse response function $\vec{h}$ combined with the resist blur function $g_{2D}$. It also includes mask blur b and vector imaging effects. The combination of any one of the resist blur function, the mask blur function or other resist stack effects, is referred to hereinafter as an exposure response. If W is 1, then Equation 45 represents resist blur at a single resist plane.

Note that the last term of the generalized bilinear kernel of Equation 45 given by $$\sum_{w=1}^{W}\sum_{m=1}^{m_{Max}} \vec{h}_{m,w}(\vec{K}';\vec{k}_S) \cdot \vec{h}_{m,w}^*(\vec{K}'';\vec{k}_S) \int\int_{ROI}$$

$$d^2\vec{R} g_{2D}(|\vec{R}|) b(\vec{r}' + \vec{R} - \vec{K}) b(\vec{r}'' + \vec{R} - \vec{K}'')$$

Equation 46 represents the bilinear impulse response of the lithographic subsystem including the (scalar or vector) projection impulse response, mask blur and resist blur. Additionally, in accordance with the present invention, the subsystem impulse response can include the scalar or vector projection impulse response plus resist blur (without mask blur), or scalar or vector projection impulse response with mask blur (without resist blur).

Even though the generalized bilinear kernel V''' of Equation 45 would ordinarily make use of the generalized vector impulse response $\vec{h}_m$ of the lens (Equation 30), we have noted above that the impulse response $\vec{h}_m$ can instead be calculated using either the electric field term $\vec{Q}$ of Equation 21 or the leading term $\vec{E}_0$ of Equation 21 in order to obtain a generalized bilinear kernel involving either the aerial image or the scalar aerial image, respectively.

Optionally, mask blur, resist blur, depth averaging and focus averaging may be added later.

Transmission Cross-Correlation Coefficients (TCCs)

If the generalized bilinear kernel $V'''(\vec{r}', \vec{r}'')$ of Equation 45 is Fourier-transformed, we obtain a generalization of what are known as the transmission cross-correlation coefficients (TCCs):

$$T''(\vec{k}', \vec{k}'') = B(\vec{k}')B(\vec{k}'')G(\vec{k}' - \vec{k}'')\int\int d\vec{k}_S S(\vec{k}_S)$$

$$H(\vec{k}' - \vec{k}_S)H^*(\vec{k}'' - \vec{k}_S)$$

$$\sum_{m}^{m_{Max}} \vec{Q}_m(\vec{k}' - \vec{k}_S; \vec{k}_S) \cdot \vec{Q}_m^*(\vec{k}'' - \vec{k}_S; \vec{k}_S),$$

Equation 47 where each capital-letter variable denotes the Fourier transform of the spatial domain quantity that is represented by the same symbol in lower-case. Variable H is an exception to this convention; we use H to denote the circular lens pupil P (e.g. a circular tophat function, equal to the Fourier transform of the scalar projection impulse response function) combined with the obliquity factor O, or more generally an aberrated scalar pupil combined with an obliquity factor and any defocus in the lens that may be present.

Application to Resist Blur Models

The generalized bilinear kernel V''' of Equation 45 includes the blurring in the optical exposure introduced by multiple reflections within the resist stack, the effect of finite resolution of the resist material itself, and (if averaged through depth) the effect of defocus within the resist layer, as well as the inherent resolution limits of a finite-NA lens imaging a vector field. However, it does not include dynamic effects that occur when the developer (which is the chemical used to develop the patterns of exposed resist) interacts with the exposed latent image to print the developed circuit feature, nor the similar effects that occur when the developed resist feature is transferred into an inorganic circuit film. These dynamic transfer effects are small, since the resist is strongly hard-limited, e.g. it is characterized by a power-law nonlinearity with the resist constrast, $\Gamma$, which is typically >10. Thus, resist development follows a constant threshold model to first order, and the goal that a given feature edge be printed at a specified target position is approximately met by requiring that the intensity at that position equal a reference intensity. This reference intensity is often chosen as the edge intensity of a particularly critical feature, since the development process is generally adjusted to print the most critical feature edge at nominal.

However, in reality resist contrast $\Gamma$ cannot be infinite, so the printed feature will usually be biased slightly away from the nominal image contour. This can be accounted for as a bias, or equivalently (for small biases) as an effective change in the edge intensity. In some development models, such as the Brunner-Ferguson model, this bias (or intensity change) is modeled as a function of the intensity and intensity slope at the nominal edge position, denoted $f(I, \partial I/\partial x)$. (Without loss of generality we consider the right edge of a horizontally oriented feature, so that image slope can be represented as a positive derivative along x.) If f is expanded in a series, we have for the effective intensity at the edge:

$$I_{eff}(\vec{r}) = I(\vec{r}) + f_{(1)}[I(\vec{r}) - I(\vec{r}_{ref})] f_{(2)}[\dot{I}(\vec{r}) - \dot{I}(\vec{r}_{ref})],$$

Equation 48 where $\dot{I}$ is shorthand for $\partial I/\partial x$, $\vec{r}_{ref}$ refers to the edge of the reference feature, and where $f_{(1)}$ and $f_{(2)}$ represent small correction coefficients.

Coefficients $f_{(1)}$ and $f_{(2)}$ can be determined analytically, or by fitting to empirical data. The effective intensity can equivalently be expressed in terms of different parameters $c_0$, $c_1$, and $c_2$, as $$I_{eff}(\vec{r}) = c_0 + I(\vec{r})(1 + c_1) + c_2 \dot{I}(\vec{r})$$

Equation 49

If the generalized bilinear kernel V for intensity I is obtained by the methods described above according to the present invention, it can immediately be modified to incorporate $c_0$ and $c_1$ by direct substitution. The kernel for $\dot{I}$ can be obtained in several ways, for example by differentiating an eigenvector expansion of V. We are then able to calculate the effective intensity $I_{eff}$ directly, rather than postcalculating it from separate calculations of intensity and intensity slope, thus speeding execution time. In accordance with the present invention, an effective generalized bilinear kernel is obtained as:

$$V_{eff}(\vec{r}', \vec{r}'') = c_0 + (1 + c_1)V(\vec{r}', \vec{r}'') +$$

$$c_2 \sum_{l=1}^{L} \mu_l(\dot{\Psi}_l^*(\vec{r}')\Psi_l(\vec{r}'') + \Psi_l^*(\vec{r}')\dot{\Psi}_l^*(\vec{r}'')),$$

Equation 50 where L represents the number of retained eigenfunctions $\Psi$ of the generalized bilinear kernel V'''. $\dot{\Psi}$ is the partial derivative of $\Psi$ with respect to x. The effective generalized bilinear kernel $V_{eff}$ can then be diagonalized into a final set of eigenfunctions.

Other empirical terms can likewise be added to $V_{eff}$. Given an general functional dependence of $\Delta I$ on the behavior of I in the vicinity of an edge, we can expand this dependence in a functional Taylor series, and obtain a lowest order linear term that takes the form of an integration of I with a first-order kernel $\Omega$ (i.e. the first order term of the functional Tayor series)

$$\Delta I(\vec{r}) = c_3 \iint_{ROI} d^2\vec{r}\,' \Omega(\vec{r}\,' - \vec{r}) I(\vec{r}\,') \qquad \text{Equation 51}$$

where we have included an explicit fitting constant $C_3$ (which may also be absorbed into $\Omega$). $\Omega$ may be determined from fits to CD data; for example, CD data that contains many different assist feature combinations. Regularizing terms can be added during the fit to ensure smooth and monotonic behavior in $\Omega$. Once $\Omega$ has been determined, the fit can be updated against later data by simply readjusting the linear coefficient $C_3$. We then have $$V_{eff}(\vec{r}\,', \vec{r}\,'') = c_0 + (1+c_1)V(\vec{r}\,', \vec{r}\,'') + \\ c_2 \sum_{l=1}^{L} \mu_l (\Psi_l^*(\vec{r}\,')\Psi_l(\vec{r}\,'') + \Psi_l(\vec{r}\,')\Psi_l^*(\vec{r}\,'')) + \\ c_3 \Delta V_\Omega(\vec{r}\,', \vec{r}\,'') \qquad \text{Equation 52}$$

where $\Delta V_\Omega$ is obtained by replacing the resist blur function $g_{2D}$ in the generalized bilinear kernel $V''(\vec{r}\,', \vec{r}\,'')$ of Equation 45 with a corrected influence function $g_\Omega$ given by:

$$g_\Omega(\vec{r}) = \iint_{ROI} d^2\vec{r}\,' \Omega(\vec{r}\,' - \vec{r}) g_{2D}(\vec{r}\,'). \qquad \text{Equation 53}$$

(Experimental determinations of the influence function are likely to determine $g_\Omega$ directly.) Note that the $(1+c_1)$ and $c_3$ terms in Equation 52 can be combined as a total blur function $$g_{eff}(\vec{r}) \equiv (1+c_1)g_{2D}(\vec{r}) + c_3 g_\Omega(\vec{r}). \qquad \text{Equation 54}$$

In many cases $g_\Omega$ will be a longer range function than $g_{2D}$. Formally, we can thus regard $g_L$ as either a long distance component of the resist blur function, or alternatively as a separate (often density-like) influence function. If readjustment in $c_1$ and $c_3$ is not contemplated, it may be desirable to carry out a one-time fitting in which (by iteration) the eigenfunctions of $V_{eff}$ itself are made to serve in the $c_2$ slope term of Equation 52. This is convenient if the tabulated kernels are to be input to pre-existing OPC software that does not support post-application of fitting kernels. On the other hand, if the long range character of $g_\Omega$ forces an increased number of retained eigenfunctions, one may prefer to leave the $c_3$ term separate from the main image generalized bilinear kernel, V''', adding it to the intensity only in cases where the most accurate OPC calculations are needed (e.g. avoiding it when checking for print-through or basic image polarity, or when carrying out initial iterations of OPC).

Generalization of SOCS Decomposition

In accordance with the present invention, the generalized bilinear kernel may be used to generalize the SOCS decomposition. The dominant eigenfunctions of the generalized bilinear kernel operator V''' (or alternatively, the Fourier transform of the dominant eigenfunctions of operator T''' which are then Fourier transformed), and their associated eigenvalues are calculated. The eigenfunctions $\Psi$ and associated eigenvalues $\mu$ satisfy the equation $$\iint_{ROI} d^2\vec{r}\,' V(\vec{r}\,', \vec{r}\,'')\Psi(\vec{r}\,') = \mu \Psi(\vec{r}\,''). \qquad \text{Equation 55}$$

Fast Pre-Computation

Equation 55 may be solved for $\Psi$ and $\mu$ using matrix eigendecomposition methods. Typically, only the largest 10 or 20 eigenvalues and associated eigenfunctions need be calculated. (We refer to these as the dominant eigenelements.) The eigenelements may be found by approximating the Equation 55 integral as a summation on a grid, with grid step of order $0.2\lambda/(NA(1+\sigma_{Max}))$, with $\sigma_{Max}$ denoting the tilt of the most obliquely incident illuminating direction used. We may also set a lower limit of, e.g. 0.4 on $\sigma_{Max}$, even in particular near-coherent exposure processes in which the maximum a value actually employed is somewhat lower. Therefore, the generalized bilinear kernel V may be approximated as a matrix, with variables $\vec{r}\,'$ and $\vec{r}\,''$ stepped out along rows and columns respectively. (Though each of these variables is actually two-dimensional, their associated 2D grids are unwrapped into an unraveled linear grid along a matrix axis.)

Variable Grid Pre-Computation

Matrix size can be reduced without sacrificing accuracy by using a variable-grid algorithm, in which a coarser grid is used where the generalized bilinear kernel is small and/or slowly varying. Let the x and y grid sizes at the kth row or column be $\Delta x_k$ and $\Delta y_k$. If we then calculate the eigenvectors $\Psi'(x_j, y_j)$ of the modified discrete matrix equation $$\mu \Psi'(x_j, y_j) = \sum_i \tilde{V}(x_i, y_i, x_j, y_j) \Psi'(x_i, y_i), \qquad \text{Equation 56}$$

where the regridded matrix $\tilde{V}$ is given by $$\tilde{V}(x_i, y_i, x_j, y_j) \equiv V(x_i, y_i, x_j, y_j) \sqrt{\Delta x_i \Delta y_i \Delta x_j \Delta y_j}, \qquad \text{Equation 57}$$

then the desired eigenvectors $\Psi(x_j, y_j)$ of the imaging kernel V will be given by $$\Psi(x_j, y_j) = \frac{\Psi'(x_j, y_j)}{\sqrt{\Delta x_j \Delta y_j}}. \qquad \text{Equation 58}$$

Reduced Basis Pre-Computation

The dominant eigenvectors and eigenvalues (Equation 58) of the kernel matrix (Equation 57) can be obtained by standard methods, such as the Lanzos method, which can avoid calculation of most non-dominant eigenelements, improving efficiency.

Matrix size can be significantly reduced by remapping to a suitable reduced basis. Preferably, a suitable reduced basis may be obtained so that the eigenvectors of the original kernel matrix are approximated by the new reduced basis vectors, for example, reduced basis vectors from previously-calculated eigenvectors obtained under similar system parameters, or reduced basis vectors formed from a coarse-grid solution. Similarly, eigenanalysis can be performed on such a reduced-basis matrix in order to obtain a good starting solution for the iterative eigensolution algorithm. To do so, the eigenvectors of the reduced-basis matrix are converted back to the original grid basis. Then, the eigenvectors for the original kernel matrix may be iteratively refined, if necessary, by methods such as the Lanzos method.

The total element count in the kernel matrix (whether V, the generalized bilinear kernel in the spatial domain, or T, which is the generalized bilinear kernel in the Fourier domain) scales as the 4th power of the ROI, and the time required to calculate the eigenelements usually increases even more rapidly (for example, eigenanalysis computation time may scale as the 3/2 power of the element count). In cases where the ROI must be unusually large (for example, when flare or other interaction from distant features must be included, or when the effective resist blur function has a long tail), it is particularly desirable to minimize the precomputation involved in calculating the kernel and its eigenfunctions. This is also important when many different system models must be computed, e.g. in data fitting.

Application of Symmetry to Pre-Computation

Evaluation time of the generalized bilinear kernel, in accordance with the present invention, can be reduced by a factor of 2 if the Hermitian symmetry of the kernel is exploited, i.e. if one exploits $$V''(\vec{r}\,', \vec{r}\,'') \equiv V''^*(\vec{r}\,'', \vec{r}\,') \qquad \text{Equation 59}$$

to eliminate half the kernel evaluations.

In many cases it is acceptable to regard the ROI boundary as circular; if so, both kernel evaluation time and matrix size can be reduced by a factor $(\pi/4)^2$ by using a circular rather than a square domain (in each variable of the kernel).

Both kernel evaluation time and eigenanalysis time can usually be reduced substantially by exploiting system symmetry. For example, projection lenses have nominal rotational symmetry if residual imperfections are neglected (at least, the underlying design form has a nominal axis of rotational symmetry even when the physical lithographic lens itself uses an off-axis imaging field), and usually it is not desirable to include residual asymmetries when carrying out OPC correction, since aberration-specific correction would entail the use of tool-specific masks, and would also force single circuit elements to undergo multiple OPC solutions when repeated in different places across the chip. Defocus is in some cases an exception to this rule, i.e. defocus can be the one aberration which should be taken into account during OPC; however, defocus preserves rotational symmetry.

Even though the present invention can handle systems that are not symmetric (and can treat images which are averaged over a scan path by using a single averaged 4D kernel), precomputation is much faster when symmetry is exploited.

System symmetry also requires symmetry in the source. Residual source asymmetries, like residual lens asymmetries, are most often deliberately neglected during OPC; however, it is often the case that even the nominal source will inherently exhibit a lesser degree of symmetry than the lens. (For example, the source may have a dipole shape even when the lens is rotationally symmetric.) In virtually all cases, the (nominal) source shape will at least have bilateral symmetry about the x and y axes. In most cases the source will also be symmetric about the 45°,135° diagonals (since this provides matching performance in vertically and horizontally oriented features), the principal exception being dipole sources. In some cases the source shape will have rotational symmetry as well (e.g. disk or annular sources). These shape symmetries are preserved in the source as a whole when the source is unpolarized, and should preferably be maintained when source polarization is deliberately customized to a more complicated distribution. Any of these customary source symmetries will be shared by the nominal projection lens (even with defocus), as well as by the isotropic films in the resist stack, and also by the isotropic mask and resist blur functions; thus it is the source symmetry which usually determines the symmetry of the entire system.

Application of Bilateral Symmetry in Pre-Computation

In nearly all cases of interest for OPC the system will exhibit bilateral symmetry about the x and y axes. We will refer to this as "dipole symmetry", since this symmetry is obeyed even by dipole sources (which are perhaps the least symmetric nominal sources used in lithography). Note that a source with dipole symmetry actually has a four-fold mirror symmetry, i.e.

$$V(x', y'; x'', y'') \equiv V(-x', y'; -x'', y''),$$

$$V(x', y'; x'', y'') \equiv V(x', -y'; x'', -y''). \qquad \text{Equation 60}$$

Equation 60 dictates a similar symmetry in the eigenfunctions of the generalized bilinear kernel V. To see this, note that if $\Psi(x', y')$ is such an eigenfunction, then application of Equation 60 after direct substitution of e.g. $\Psi(-x', y')$ into Equation 55 demonstrates that $\Psi(-x', y')$ will also be an eigenfunction of V with the same eigenvalue. We thus see by forming the linear combinations $[\Psi(x', y') \pm \Psi(-x', y')]/\sqrt{2}$ that the eigenfunctions of V will be either odd or even in x (and likewise y), or, in the case of two-fold degeneracy in $\mu$, that the associated eigenfunctions will be spanned by subspace eigenbasis functions that are odd or even only.

Let us then specify the odd or even symmetry of $\Psi$ along x with the parameter $\xi_x$, so that $\xi_x = -1$ when $\Psi$ has odd symmetry, and $+1$ with even symmetry. Similarly, we use parameter $\xi_y$ to specify the y-symmetry of $\Psi$. By making the appropriate changes of variables in the Equation 55 integral, we can then remap the domain of integration to the positive x', y' quadrant:

$$\mu \Psi(x'', y'') = \int_0^{ROI} dx' \int_0^{ROI} dy' \Psi(x', y') \qquad \text{Equation 61}$$

$$[V(x', y'; x'', y'') +$$

$$\xi_x V(-x', y'; x'', y'') +$$

$$\xi_y V(x', -y'; x'', y'') +$$

$$\xi_x \xi_y V(-x', -y'; x'', y'')].$$

The integration domain in Equation 61 has ¼ the area of that in Equation 55, and it need only be evaluated over ¼ as large a range in x'',y'' (namely 0<x''<ROI, 0<y''<ROI), since $\Psi$ is determined by symmetry in the other (negative) quadrants (according to $\xi_x, \xi_y$). The matrix obtained by discretizing Equation 61 thus contains 1/16 the number of elements as would be obtained by simply discretizing Equation 55, and the eigenelements of an Equation 61 matrix can be found far more rapidly (e.g. in 1/64 the time if eigensolution speed scales as the 3/2 power of element count). However, Equation 61 must be solved four times (since there are four different combinations of $\xi_x, \xi_y$), so in a typical case the total eigensolution time may improve by about 16× when bilateral system symmetry is exploited in this way. Speed also improves because generalized bilinear kernel V of the present invention need only be evaluated at 1/4 as many points. Once the separate (dominant) eigensolutions are obtained for each combination of $\xi_x$ and $\xi_y$, they are merged and resorted to obtain the dominant eigenelements of V. Note that different $\xi_x, \xi_y$ combination generally produce different eigenvalues.

Application of Quadrupole Symmetry to Pre-Computation

Besides having symmetry about the x and y axes, the source (and the projection system as a whole) will in most cases also have bilateral symmetry about the ±45° diagonals. We will refer to this as "quadrupole symmetry", since it is obeyed by standard quadrupole source shapes; note that it implies an eight-fold mirror symmetry of the system about the boundaries of each octant. The generalized bilinear kernel for such systems will obey the relation $$V(x', y'; x'', y'') \equiv V(y', x'; y'', x'') \quad \text{Equation 62}$$

while continuing to obey the Equation 59 and Equation 60 dipole and Hermitian symmetries. We can exploit the Equation 62 symmetry in somewhat the same way as was done above with dipole symmetry, but the quadrupole case is more complicated. If with a quad-symmetric kernel we substitute the transpose $\Psi(y',x')$ of an eigenfunction satisfying Equation 61 into the Equation 61 operator (i.e. we apply the folded dipole-symmetry kernel to the transposed [diagonally flipped] eigenfunction), then make a change of variables (swap) $x' \to y', y' \to x'$ in the integral, and then apply Equation 62, we see that (with appropriate choice of $\xi_x$ and $\xi_y$) $\Psi(y',x')$ will be an eigenfunction of V with the same eigenvalue as $\Psi(x', y')$. Moreover, if $\xi_x = \xi_y$, the transposed eigenfunction will have the same dipole symmetry as $\Psi(x', y')$, i.e. it will satisfy Equation 61 under the same values of $\xi_x$ and $\xi_y$. Thus, we first consider determination of the subset of quad eigenfunctions which obey the dipole symmetry $\xi = +1$ or $-1$, where $\xi$ is defined by $\xi \equiv \xi_x = \xi_y$. This set of quad eigenfunctions is obtained by reducing Equation 61 to an integration over one octant:

$$\mu \Psi(\vec{r}'') = \int_0^{ROI} dx' \int_0^{ROI} dy' \Psi(x', y') \quad \text{Equation 63}$$

$$[V(x', y'; \vec{r}'') + V(-x', -y'; \vec{r}'') +$$

$$\xi\{V(-x', -y'; \vec{r}'') + V(x', -y'; \vec{r}'')\} +$$

$$\xi_{45}(V(y', x'; \vec{r}'') + V(-y', -x'; \vec{r}'') +$$

$$\xi\{V(-y', x'; \vec{r}'') + V(y', -x'; \vec{r}'')\})]$$

where $\xi_{45}$ can be +1 or −1. If Equation 63 is solved by reduction to a discrete grid (i.e. to matrix equations), its solution for given $\xi$ entails eigenanalysis of two matrix choices (corresponding to the choices $\xi_{45}=+1$ and $\xi_{45}=-1$), each reduced in size 4× from the dipole symmetry case. If solution time scales as the 3/2 power of element count, this provides a net 4× speed improvement over the corresponding portion of the dipole eigenanalysis. 2× fewer kernel evaluations are needed.

The remaining quad-symmetry eigenfunctions are those associated with $\xi_x = -\xi_y$ (i.e. they are solutions with what may be termed opposed or x-y-asymmetric dipole symmetry); these do not obey an octagonal folding of the kind exploited in Equation 63. This may be seen by substituting $\Psi(y',x')$ into Equation 61 as above; we find that in this case the transposed $\Psi$ is an eigenfunction with the same eigenvalue as $\Psi(x', y')$, but with opposite dipole parameters (i.e. with $\xi_x \to \xi_y, \xi_y \to \xi_x$. Thus, to exploit quadrupole symmetry in calculating such eigenelements, we first solve a single opposed-symmetry combination using the dipole-symmetry folded kernel of Equation 61 (e.g. we choose $\xi_x=+1, \xi_y=-1$, and solve that case as a dipole). After doing so, the eigenfunctions for the remaining case (e.g. $\xi_y=+1; \xi_x=-1$) are recovered immediately by taking the transpose of the first set (e.g. $\Psi(y',x')$). This represents a net 2× speed improvement over the corresponding steps of the dipole solution. Likewise, only half as many kernel evaluations are needed if Equation 62 is exploited.

Though quadrupole symmetry implies that $\Psi(y',x')$ will be an eigenfunction whenever $\Psi(x', y')$ is an eigenfunction, this is a rather trivial result when $\xi_x = \xi_y = \pm 1$, because in those cases the octagonal folding symmetry of Equation 63 indicates that $\Psi(y',x')$ and $\Psi(x', y')$ will actually be the same function (to within multiplication by −1). However, the eigenfunctions for the remaining two dipole cases ($\xi_x=-\xi_y=+1$ and $\xi_x=-\xi_y=-1$), though related by a simple transpose, are distinct functions (with the same eigenvalue); thus the (equal) eigenvalues obtained in these cases are two-fold degenerate. When $\xi_x=-\xi_y$, any linear combination of $\Psi(y', x')$ and $\Psi(x', y')$ will also be an eigenfunction having the same eigenvalue.

Application of Rotational Symmetry in Pre-Computation

If the optical system is rotationally symmetric, we can find the eigenelements using a numerical version of the method disclosed in R. M. von Bunau, Y. C. Pati, and Y.-T. Wang, "Optimal coherent decompositions for radially symmmetric optical systems," J. Vac. Sci. Technol. B 15, no. 6 (1997), p. 2412, hereinafter referred to as Von Bunau, the contents of which are hereby incorporated by reference in its entirety. (Von Bunau also found analytic expressions for the eigenfunctions of the focused Hopkins kernel in the case of disk or annular sources.) In all likelihood the majority of lithographic sources in use today are disk-shaped or annular, and these sources will be circularly symmetric if unpolarized or tangentially polarized (or if treated as scalar). Rotational symmetry is preserved under defocus, and also in the presence of isotropic mask or resist blur, and likewise within isotropic layers of the resist film stack. Rotational symmetry is a continuous symmetry, and as shown below this allows us to reduce the dimensionality of the eigenproblem by 1, providing a considerable time saving (increasingly so as problem size increases). Moreover, since we are only interested in the dominant eigenelements, we can reduce the dimensionality from 4 to "2.5", in the sense that decomposition of several 2D problems can replace decomposition of the symmetry-derived 3D kernel; in cases of practical interest the additional time savings is appreciable. Note also that with radial symmetry, all Fourier transforms are efficiently carried out using fast Hankel transforms.

To see how these savings are realized, we consider the generalized bilinear kernel $V''(\vec{r}', \vec{r}'')$ of Equation 45 in the case of an unpolarized source. In that case $m_{Max}$ is 2, and the sum extends over uncorrelated images under x-polarized and y-polarized illumination; thus under the ideal lens model for the s polarization component of the electric field of Equation 10 and p component of the electric field of Equation 11, in accordance with the present invention, the generalized bilinear kernel V''' becomes:

$$V'''(\vec{r}', \vec{r}'') = j(\vec{r}' - \vec{r}'') \iint_{ROI} d^2\vec{R} g_{2D}(|\vec{R}|)$$
$$[\vec{h}_x(\vec{r}' + \vec{R}) \cdot \vec{h}_x^*(\vec{r}'' + \vec{R}) +$$
$$\vec{h}_y(\vec{r}' + \vec{R}) \cdot \vec{h}_y^*(\vec{r}'' + \vec{R})],$$

Equation 64 where $j(\vec{r})$ is the coherence function occurring in the Hopkins kernel of Equation 2, and where the projection impulse response function is $$\vec{h}_m(\vec{r}) \equiv \iint d^2\vec{K} \vec{h}_m(\vec{K}) b(\vec{r} - \vec{K}).$$

Equation 65

We therefore form over one octant of $\vec{r}$ the function $$f(\vec{r}, s) = j(2s)[\vec{h}_x(\vec{r} - s\hat{x} + \vec{R}) \cdot \vec{h}_x^*(\vec{r} + s\hat{x} + \vec{R}) + \vec{h}_y(\vec{r} - s\hat{x} + \vec{R}) \cdot \vec{h}_y^*(\vec{r} + s\hat{x} + \vec{R})],$$

Equation 66 and then fill in the remainder of the $\vec{r}$ domain by symmetry. After convolving f with $g_{2D}$ by FFT, then, in accordance with the present invention, the symmetric generalized bilinear kernel V''' can be expressed as a 3D function in polar coordinates:

$$V'''(\vec{r}', \vec{r}'') = V'''(r', \theta'; r'', \theta'') \equiv$$
$$\tilde{V}'''(r', r'', \theta' - \theta'') = f(r'\cos(\theta) + r''r'\sin(\theta),$$
$$\sqrt{r'^2 + r''^2 - 2r'r''\cos(\theta)})$$

Equation 67 where $\theta \equiv \theta' - \theta''$.

If we then denote the m th order azimuthal Fourier component of $\tilde{V}'''$ as $v_m$, i.e.

$$v_m(r', r'') \equiv \int_o^{2\pi} d\theta \tilde{V}'''(r', r'', \theta) e^{im\theta}$$

Equation 68 we can reduce the eigenanalysis problem for a given value of m to a purely radial one (1D in each variable). When calculating those eigenfunctions of V''' that are associated with the m th azimuthal order, we find that the j th such eigenfunction is given by $$\Psi_{j,m}(r, \theta) = \frac{1}{\sqrt{r}} \varphi'_{j,m}(r) \cos m\theta \text{ if } m > 0,$$
$$= \frac{1}{\sqrt{r}} \varphi'_{j,0}(r) \text{ if } m = 0,$$
$$= \frac{1}{\sqrt{r}} \varphi'_{j,-m}(r) \sin m\theta \text{ if } m < 0,$$

Equation 69 where $\varphi'_{j,m}$ denotes the j th eigenfunction of the symmetrized 2D radial kernel obtained from $v_m$, i.e.

$$\lambda_{j,m}\varphi'_{j,m}(r'') = \int_0^{ROI} dr' \sqrt{r'r''} v_m(r', r'') \varphi'_{j,m}(r').$$

Equation 70

The eigenvalue associated with $\Psi_{j,m}$ is $\lambda_{j,m}$. Note that the eigenvalues are degenerate when $m \neq 0$; the eigenfunctions $\Psi_{j,m}$ defined in Equation 69 for +m and −m then provide a pair that span the subspace. A reasonable value for m is about 10.

Application of the Generalized Bilinear Kernel to OPC

Once the eigenelements are calculated, the image intensity $I(\vec{r})$ in accordance with the present invention may be calculated at OPC fragmentation points in much the same way as is done in conventional OPC methods. For example, this may be done by pre-storing a set of sector convolutions $C_\Psi$ for each of the dominant eigenfunctions $\Psi$ (for Manhattan geometries, this set need contain only a single such sector convolution, representing convolution with a 90° corner; however other geometries require additional convolutions for other corner angles). The image intensity at point $\vec{r}$ is then calculated by a sum over M dominant eigenelements and L corners enclosed within the ROI:

$$I_{Litho}(\vec{r}) = \sum_{m=1}^{M} \mu_m \left| \sum_{l=1}^{L} \delta_l C_{\Psi,m}(\vec{r} - \vec{r}_l) \right|^2,$$

Equation 71 where $\vec{r}_l$ is the position of the lth corner, and where $\delta_l$ is +1 or −1, depending on the order in which the corner occurs when tracing the perimeter of the polygon that contains it (see K. Lai et al., co-assigned U.S. patent application Ser. No. 10/694,466). The $C_\Psi$ tables can then be used by MBOPC software (including software that is designed for use with the Hopkins model).

Equation 71 is easy to differentiate with respect to position $\vec{r}$, for example in a direction perpendicular to the polygon's edge, and one can prestore tables of the derivatives of the $C_\Psi$. This means, as discussed further below, that resist development models which involve image slope can also exploit the fast computation speed provided by the present invention.

At this point it is appropriate to consider some computational aspects of Equation 45 for the generalized bilinear kernel V''' and Equation 47 for the transmission cross-correlation coefficient T'''. Their evaluation is complicated by the dependence of $\vec{h}_m$ on both $\vec{r}'$ and $\vec{k}_s$. (Of course, this evaluation is only required during the pre-calculation steps of the invention; once the eigenfunctions of the resulting kernel are obtained, Equation 45 imposes no computational burden when the invention is actually applied to the mask shapes of interest.) As noted in the discussion surrounding Equation 27 regarding a polarized source, the dependence of $\vec{h}_m$ on $\vec{k}_s$ arises with sources that have customized (non-uniform) polarization. The most-well-known examples are probably annular sources in which the polarization is made tangential in order to image critical spatial frequencies (at high NA) in transverse electric field (TE) polarization. The polarization changes in the ray polarization $\vec{E}$ that are incurred between mask and wafer will depend only on the diffracted direction $\vec{k}''$, but the polarization that diffracts from the mask will also be dependent on the polarization of the illuminating ray, and hence on $\vec{k}_s$. Let $X_x$ and $X_y$ denote the x' and y' polarization components of the illuminating ray (in the local coordinate system for source polarization described above), so that $X_x$ and $X_y$ provide a map of the polarization distribution of the source, which may be tailored or customized. Then, using the thin-mask approximation, the following expression for the p component of the ray polarization after diffraction from the mask is obtained:

$$\vec{E}_p(\hat{\kappa}, \vec{k}_S) = A(\vec{\kappa} + \vec{k}_S)S(\vec{k}_S)[X_{x'}(\vec{k}_S)D_{p,x'}(\hat{\kappa}; \vec{k}_S) + X_{y'}(\vec{k}_S)D_{p,y'}(\hat{\kappa}, \vec{k}_S)]\hat{p}.$$  Equation 72

(A similar expression holds for the s component.) Here $A(\hat{\kappa}, \kappa_s)$ is a Fourier component of the mask pattern, given by Equation 13. We have chosen to break out the intensity $S(\vec{k}_s)$ along the illuminating ray as a separate term, making $X_x$ and $X_y$ the components of a unit vector. The D coefficients represent the dependence of diffracted polarization on illuminating polarization. For example, under the generalized assumption of spatial invariance discussed above, we would take the diffracted polarization in the case of e.g. an x'-polarized source to be independent of illuminating ray direction. We indicate this $\vec{k}_s$-independence by adding a superscipt (H) (to denote pupil H rather than source S). If we further apply the specific model used above to derive Equation 10 and Equation 11, we have (see Equation 11)

$$D_{p,x'}(\hat{\kappa}; \vec{k}_S)\hat{p} \equiv \vec{D}^{(H)}_{p,x'}(\hat{\kappa}) = \frac{\hat{x}' \cdot \hat{\kappa}}{|\hat{z} \times \hat{\kappa}|}\hat{p}.$$  Equation 73

(We have also absorbed the p unit vector into $D^{(H)}$, making it a vector quantity.)

Rapid evaluation of the integrals comprising the generalized bilinear kernel V''' of Equation 45 does not force the use of the simple spatial invariance model of Equation 73. More generally, we need only assume that $D_{p,x'}$ (along with $D_{p,y'}, D_{s,x'},$ and $D_{s,y'}$) can be written in separable form within each region of the source. For example if we divide the source into a total of J regions, each referenced by index j, then we require that $$D_{j,p,x'}(\hat{\kappa}, \vec{k}_S)\hat{p} = D^{(H)}_{j,p,x'}(\hat{\kappa})D^{(S)}_{j,p,x'}(\vec{k}_S),$$  Equation 74 for each of the J source regions. (Either $D^{(H)}$ or $D^{(S)}$ may be a vector quantity.) Noting that both the lens parameters in Equation 25 and the film-stack parameters in Equation 26 are independent of illumination direction (and bearing in mind the simple geometrical correspondence between the various ray direction variables k'', k' and $\hat{\kappa}$, we can collapse all dependence in $\vec{Q}$ on ray direction into generalized D coefficients [which we denote $\vec{D}^{(H)}(\vec{\kappa}'')$] that are specific to the source polarization (i.e. to the specific x' and y' components along a given illuminating ray) and to the source region j. The projection impulse response function $\vec{h}_m$ Equation 30 then becomes $$\vec{h}_{m,j}(\vec{r} - \vec{r}'; \vec{k}_S) \equiv \iint_{NA} d^2\vec{k}'' P(\vec{k}'')O(\vec{k}'')e^{i\vec{k}''\cdot(\vec{r}-\vec{r}')}$$  Equation 75

$$\left[\left(\vec{\tilde{D}}^{(H)}_{j,p,x'}(\vec{k}'')D^{(S)}_{j,p,x'}(\vec{k}_S) + \vec{\tilde{D}}^{(H)}_{j,s,x'}(\vec{k}'')D^{(S)}_{j,s,x'}(\vec{k}_S)\right)\chi_{x'}(\vec{k}_S) + \right.$$

$$\left. \left(\vec{\tilde{D}}^{(H)}_{j,p,y'}(\vec{k}'')D^{(S)}_{j,p,y'}(\vec{k}_S) + \vec{\tilde{D}}^{(H)}_{j,s,y'}(\vec{k}'')D^{(S)}_{j,s,y'}(\vec{k}_S)\right)\chi_{y'}(\vec{k}_S)\right]$$

$$\equiv \vec{\tilde{h}}_{m,j,p,x'}(\vec{r} - \vec{r}')\tilde{S}_{p,x'}(\vec{k}_S) +$$

$$\vec{\tilde{h}}_{m,j,p,y'}(\vec{r} - \vec{r}')\tilde{S}_{p,y'}(\vec{k}_S) +$$

$$\vec{\tilde{h}}_{m,j,s,x'}(\vec{r} - \vec{r}')\tilde{S}_{s,x'}(\vec{k}_S) +$$

$$\vec{\tilde{h}}_{m,j,s,y'}(\vec{r} - \vec{r}')\tilde{S}_{s,y'}(\vec{k}_S)$$

where we have introduced impulse response components $\vec{h}$ that do not depend on the illuminating ray direction (except through index j), and where we have combined the illumination-dependent terms $D^{(S)}$ and S into single factors denoted S.

The generalized bilinear kernel of Equation 45 becomes $$V''(\vec{r}', \vec{r}'') = \sum_{j=1}^{J} \iint d^2\vec{K}' d^2\vec{K}''$$  Equation 76

$$\iint_\sigma d^2\vec{k}_S S(\vec{k}_S)e^{i\vec{k}_S\cdot(\vec{K}'-\vec{K}'')} \times$$

$$\sum_{m=1}^{m_{Max}} \left[\vec{\tilde{h}}_{m,j,p,x'}(\vec{K}')\tilde{S}_{p,x'}(\vec{k}_S) + \vec{\tilde{h}}_{m,j,p,y'}(\vec{K}')\right.$$

$$\tilde{S}_{p,y'}(\vec{k}_S) + \vec{\tilde{h}}_{m,j,s,x'}(\vec{K}') + \tilde{S}_{s,x'}(\vec{k}_S) +$$

$$\left.\vec{\tilde{h}}_{m,j,s,y'}(\vec{K}')\tilde{S}_{s,y'}(\vec{k}_S)\right] \cdot \vec{\tilde{h}}_{m,j,p,x'}(\vec{K}'')$$

$$\tilde{S}_{p,x'}(\vec{k}_S) + \vec{\tilde{h}}_{m,j,p,y'}(\vec{K}'')\tilde{S}_{p,y'}(\vec{k}_S) + \vec{\tilde{h}}_{m,j,s,x'}$$

$$\left(\vec{K}''\right)\tilde{S}_{s,x'}(\vec{k}_S) + \vec{\tilde{h}}_{m,j,s,y'}(\vec{K}'')\tilde{S}_{s,y'}(\vec{k}_S)\Big]^* \times$$

$$\iint_{ROI} d^2\vec{R} g_{2D}(|\vec{R}|)b(\vec{r}' + \vec{R} - \vec{K}')b(\vec{r}'' + \vec{R} - \vec{K}'')$$

If the dot products are expanded out, the integrals for the generalized bilinear kernel $V''(\vec{r}', \vec{r}'')$ reduce to a sum of bilinear integral terms in $\vec{h}$. Several approaches are available to evaluate these bilinear terms. For example, one method ferst considers the preliminary case of no blurring from resist or mask (Equation 33). In the no-blur case, V is given by a sum of terms having the form $$V_{e,f;no-blur} = \vec{\tilde{h}}_e(\vec{r}') \cdot \vec{\tilde{h}}_f^*(\vec{r}'')$$  Equation 77

-continued $$\iint_\sigma d^2k_S S(\vec{k}_S)\tilde{S}_e(\vec{k}_S)\tilde{S}_f^*(\vec{k}_S)e^{i\vec{k}_S''(\vec{r}'-\vec{r}'')}$$

$$\equiv \vec{\tilde{h}}_e(\vec{r}')\cdot\vec{\tilde{h}}_f(\vec{r}'')J_{e,f}(\vec{r}'-\vec{r}'')$$

$$\cong \sum_{n=1}^N \eta_{n,e,f}\Theta_{n,e,f}^*(\vec{r}')\Theta_{n,e,f}(\vec{r}'')$$

where subscripts e and f can refer to any terms in the sum, and where a coherence term J has been introduced to denote the result of the source integral, and where in the last line we have approximated the unblurred V term by a bilinear sum of its dominant eigenfunctions (which are denoted Θ).

When resist and/or mask blur is added, the expression for the generalized bilinear kernel V''' (Equation 76, where the double prime on V denotes the presence of blur) contains blurred versions of the same set of bilinear terms in $\vec{h}$ that arise without blur (given in Equation 77). When blur is added, these terms take the form $$V_{e,f}'' = \int d^2\vec{R}\, g_{2D}(|\vec{R}|)\iint d^2\vec{K}'d^2\vec{K}''J_{e,f}(\vec{K}'-\vec{K}'')b(\vec{r}'+\vec{K}')b(\vec{r}''+\vec{R}-\vec{K}'')\vec{h}_e(\vec{K}')\cdot\vec{h}_f^*(\vec{K}'')$$ Equation 78

Substituting from Equation 77, this becomes $$V_{e,f}'' = \sum_{n=1}^N \eta_{n,e,f}\iint_{ROI} d^2\vec{R}\, g_{2D}(|\vec{R}|)$$ Equation 79

$$W_{n,e,f}(\vec{r}'+\vec{R})W_{n,e,f}^*(\vec{r}''+\vec{R}) \text{ where}$$

$$W_{n,e,f}(\vec{r}) \equiv \iint d^2\vec{K}\Theta_{n,e,f}(\vec{K})b(\vec{r}-\vec{K}).$$ Equation 80

The functions in the generalized bilinear kernel V''' of Equation 79 are smoothly varying and hence easy to integrate numerically in the spatial domain. The number of integrations involved is similar to that involved in the calculation of scalar TCCs in an ordinary Hopkins model (though of course many such e,f combinations must be evaluated in the most general case).

Another approach to calculating V''' is to use integration in the frequency domain (T''' of Equation 47), which can be easier than spatial-domain integration (except in the case of simple convolution) if one explicitly determines the boundary intersections of the pupil H and source S functions. The spatial domain kernels V''' can then be determined by inverse transform. Efficient integration bounds in the frequency domain are defined by the bandlimited system response, and the periodic repeats of the object structure that are implicitly generated by integration against a discrete grid in the frequency domain may mimic excluded mask structure (i.e. exterior to the ROI) in a more realistic way than does simple spatial domain truncation.

More preferably, another approach is to employ a mixed strategy. If the Equation 77 blur-free eigenfunctions $\Theta_{n,e,f}$ are Fourier transformed (we denote their transforms by $\tilde{\Theta}_{n,e,f}$), the transform of Equation 79 becomes $$T_{e,f}''(\vec{k}',\vec{k}'') = B(\vec{k}')B(\vec{k}'')G(\vec{k}',\vec{k}'')$$ Equation 81

$$\sum_{n=1}^N \eta_{n,e,f}\tilde{\Theta}_{n,e,f}^*(\vec{k}')\tilde{\Theta}_{n,e,f}(\vec{k}'')$$

which after tabulation can be inverse transformed to obtain $V_{e,f}''$. The eigenfunctions may also be transformed. The advantage of this approach is that, as shown by the middle line of Equation 77, tabulation of the unblurred kernel V does not require repeated integral evaluations. (One-time Fourier transforms are required, but these precede the tabulation loops, and may be carried out quickly by Fast Fourier Transform (FFT).) Once the unblurred kernel is calculated and eigendecomposed, it can be converted rapidly to the frequency domain by FFT, where application of blur is again a simple matter of function evaluation (no integration). However, this procedure does require two eigenanalysis steps.

Figure 4:
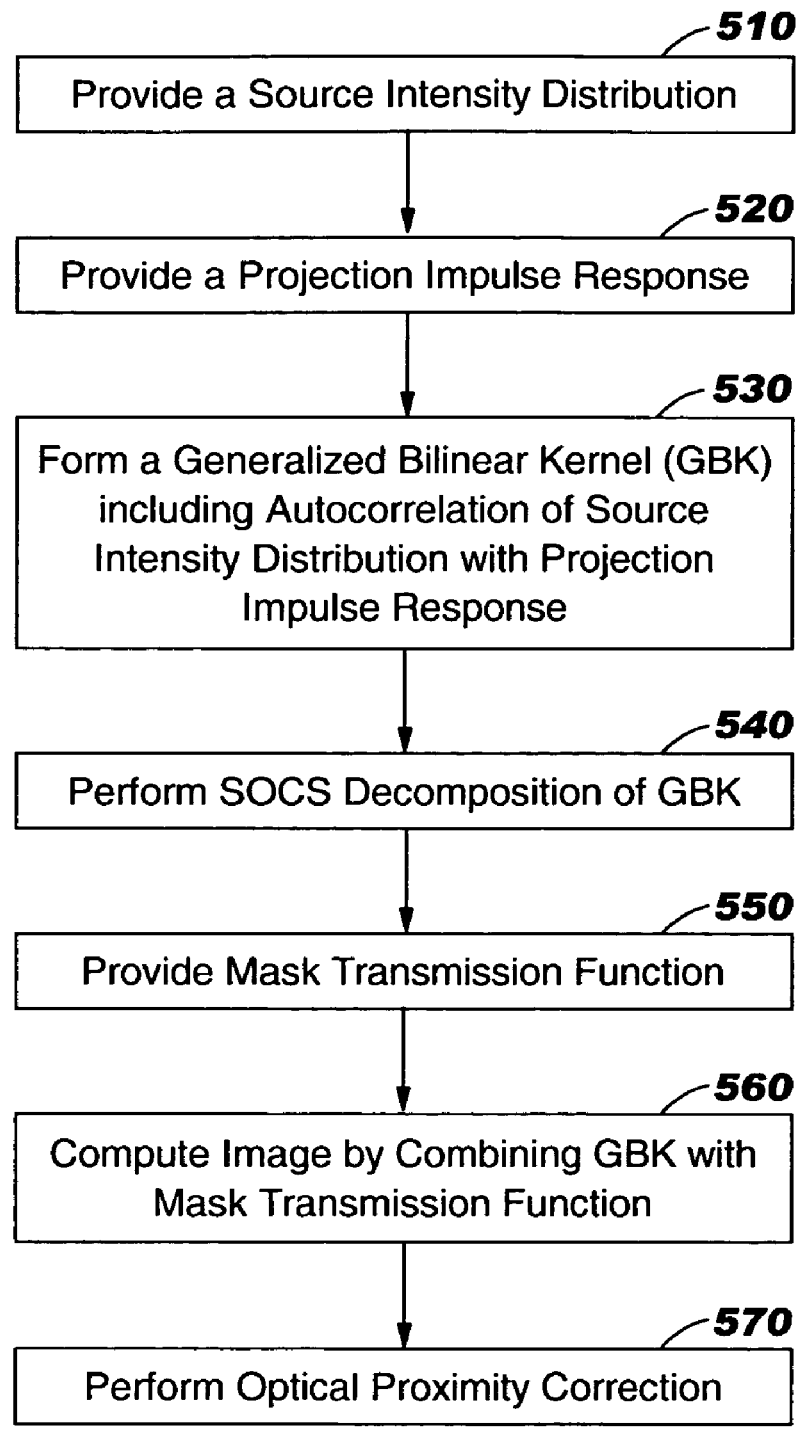

In summary, the present invention is directed to an efficient method and system for computing lithographic images that takes into account vector effects such as lens birefringence, resist stack effects and tailored source polarizations, and may also include blur effects of the mask and the resist. In accordance with the present invention, these effects are included by forming a generalized bilinear kernel, which can then be treated using a SOCS decomposition to allow rapid computation of an image that includes such non-scalar effects. Referring to FIG. 4, a preferred embodiment of the method according to the invention includes providing a source intensity distribution $S(\vec{k}_s)$ (Block 510). The source can be characterized by an intensity distribution $S(\vec{k}_s)$, and may be characterized by independent polarizations m, each of which is characterized by a polarization map (such as $X_x, X_y$ in reference to Equation 72). A projection impulse response function $\vec{h}_m$ is provided (Block 520), which preferably includes the vector impulse response function of the lens including lens birefringence (e.g. Equation 30), but may also be generalized to include vector effects in the resist film stack as in Equation 31. Furthermore, in the case of a source with tailored polarization, the projection impulse response function $\vec{h}$ may also include the source polarization map ($X_x, X_y$ for example, as illustrated by Equation 75. A generalized bilinear kernel $V(\vec{r}', \vec{r}'')$ is formed (Block 530) by forming a bilinear autocorrelation of the source intensity distribution $S(\vec{k}_s)$ with the vector impulse response function $\vec{h}(\vec{k}', \vec{k}_s)$. A generalized bilinear kernel can be formed to include mask blur, as in Equation 41. Resist blur may be included in a generalized bilinear kernel, for example, as shown in Equation 45, where averaging over the depth of the resist stack and/or a range of focus positions may be performed. Preferably, a SOCS decomposition of the generalized bilinear kernel is performed (Block 540), as discussed further below. The generalized bilinear kernel V is formed so as to be independent of the mask transmission function $m(\vec{r})$, which is provided in Block 550. The image $I(\vec{r})$ at a point $\vec{r}$ is then computed (Block 560) by combining, or more particularly, performing a bilinear integration of the generalized bilinear kernel with the mask transmission function, as, for example, in Equation 28, Equation 32, Equation 40, or Equation 44. The resulting image $\vec{I(r)}$ can then be used to perform model-based optical proximity correction (MBOPC) at Block 570.

In a preferred embodiment of the present invention, the SOCS decomposition of the generalized bilinear kernel (Block 540) may be performed as illustrated in FIG. 5. First the image plane within the ROI integration domain is gridded (Block 541). If possible, in accordance with the invention, the ROI integration domain is preferably folded according to the symmetry of the system (Block 542). The generalized bilinear kernel (GBK) is computed and tabulated at the grid points of the image plane (Block 543), in the folded ROI integration domain. In this preferred embodiment, the tabulated GBK values are remapped to a reduced basis (Block 544), and then the eigenfunctions of the GBK are calculated in the reduced basis, and converted back to the original grid (Block 545). If necessary, the dominant eigenfunctions may be iteratively refined against the tabulated GBK values, for example, as in the Lanczos method (Block 546). Then, the convolutions of the dominant eigenfunctions with the possible mask polygon sectors are pre-computed (Block 547).

Figure 6:
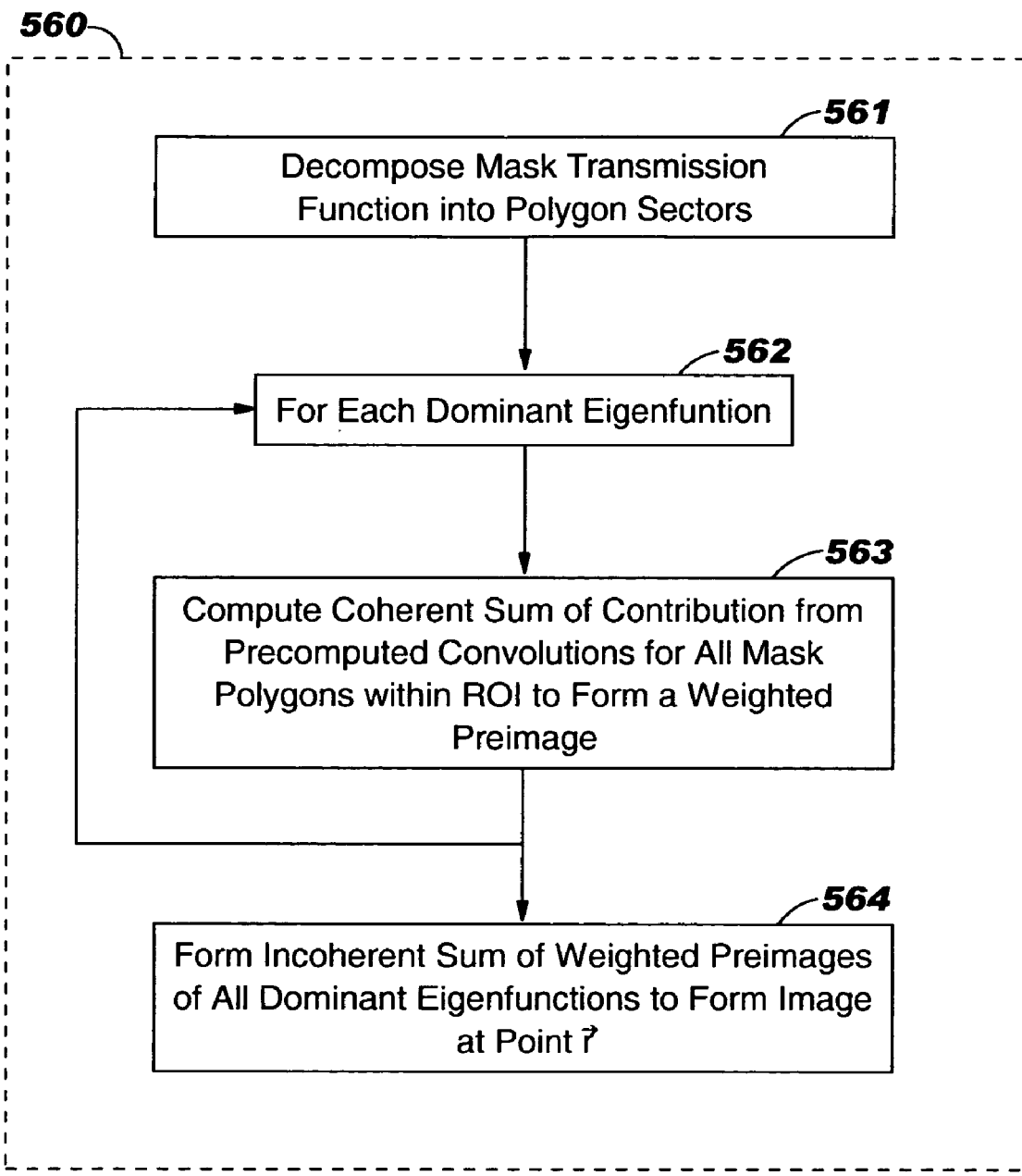

A preferred embodiment for computing the image (Block 560) is illustrated in FIG. 6. First, the mask transmission function that was provided in Block 550 is decomposed into an appropriate set of the possible polygon sectors (Block 561). Then, for each of the dominant eigenfunctions (Block 562), a pre-image is computed by forming the coherent sum of the contributions from the pre-computed convolutions of the dominant eigenfunctions with the mask polygon sectors within the ROI (Block 563). The pre-image is weighted, preferably by the eigenvalue of the eigenfunction, and in particular, more preferably by the square root of the eigenvalue. Alternatively, the weights may be determined empirically. Finally, the image $\vec{I(r)}$ is formed (Block 564) from the incoherent sum of the weighted pre-images of all the dominant eigenfunctions.

The present invention has the advantage that non-scalar effects such as vector effects including tailored source polarization, lens birefringence, and resist stack polarization, as well as blur in the mask or resist, can be incorporated efficiently in image calculation using techniques such as SOCS decomposition. For example, the computation of the image (Block 550) can be performed efficiently by a method such as outlined in FIG. 5. The mask polygons may be decomposed, for example, as sectors (Block 551), as indicated by Equation 71. Similarly, the image plane may also be decomposed, for example, by gridding (Block 552). A SOCS decomposition of the generalized bilinear kernel of the present invention may be performed, independently of the mask transmission function (Block 553). The dominant eigenfunctions and eigenvalues may be obtained (Block 553), for example, by using the Lanzos method.

Figure 7:
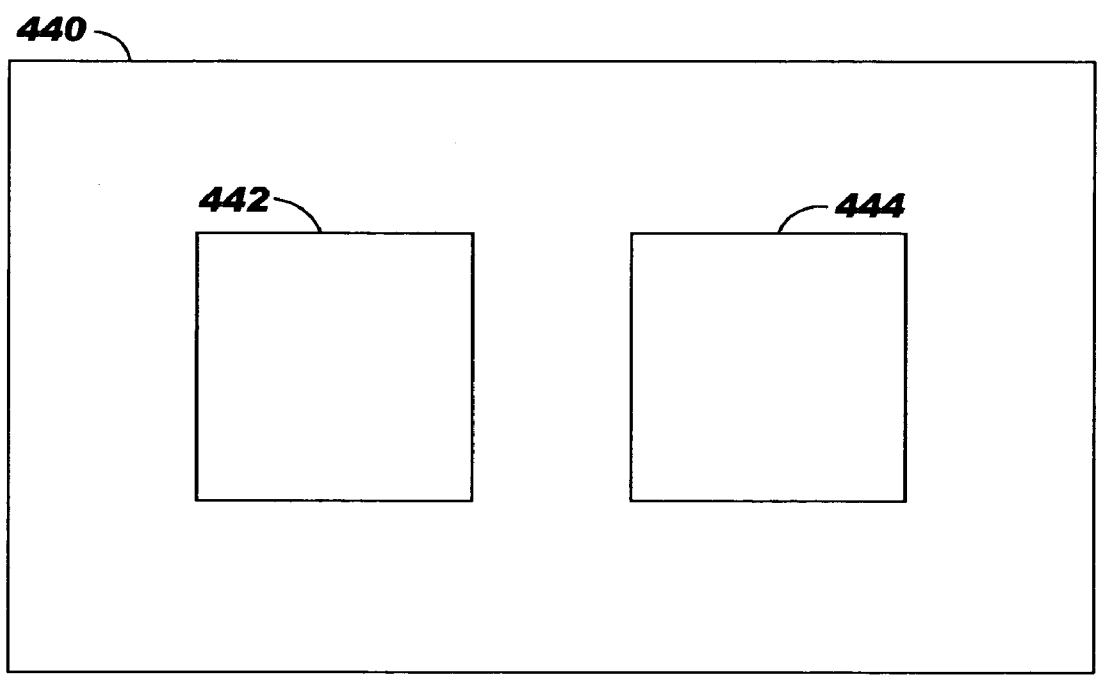
FIG. 7 illustrates a computer system configured to perform the method according to the present invention.

The method of the present invention for computing an image of an integrated circuit design may be implemented by a computer program or software incorporating the process steps and instructions described above in otherwise conventional program code and stored on an electronic design automation (EDA) tool or an otherwise conventional program storage device. These instructions include providing an impulse response function for the projection lens (which may include resist stack effects and blur), the generation of a generalized bilinear kernel, taking into account vector effects, and performing a SOCS-like decomposition of the generalized bilinear kernel, using methods as described above. The instructions to perform the method of the present invention may be incorporated into program code to perform model-based OPC. As shown in FIG. 7, the program code, as well as any input information required, may be stored in EDA tool or computer 440 on program storage device 442, such as a semiconductor chip, a read-only memory, magnetic media such as a diskette or computer hard drive, or optical media such as a CD or DVD ROM. Computer system 440 has a microprocessor 444 for reading and executing the stored program code in device 442 in the manner described above.

It will be appreciated by those skilled in the art that the method and system for performing the method in accordance with the present invention is not limited to the embodiments discussed above. Accordingly, the invention is intended to encompass all such alternatives, modifications and variations which fall within the scope and spirit of the invention and the following claims.

What is claimed is:

1. A method for determining an image formed by means including a projection system having an illumination source of illumination energy and a projection lens for projecting the illumination energy, wherein a mask is disposed between the illumination source and the projection lens, the method comprising the steps of:

providing a source intensity distribution;

providing a projection impulse response, said projection impulse response comprising an impulse response of the projection lens to the illumination energy; and forming a generalized bilinear kernel comprising an autocorrelation of the source intensity distribution with the projection impulse response, wherein said generalized bilinear kernel comprises at least one non-scalar effect due to the vector character of the electric field of the illumination energy.

2. The method of claim 1 further comprising:

providing a mask transmission function; and providing an expression for the image, said expression comprised of said generalized bilinear kernel and said mask transmission function, wherein said generalized bilinear kernel is independent of said mask transmission function.

3. The method of claim 2 wherein the image is an aerial image.

4. The method of claim 2 wherein the image is a resist image.

5. The method of claim 1 wherein said autocorrelation further includes a resist blur function.

6. The method of claim 5 further comprising:

providing a mask transmission function; and providing an expression for a resist image, said expression comprised of said generalized bilinear kernel and said mask transmission function, wherein said generalized bilinear kernel is independent of said mask transmission function.

7. The method of claim 1 further comprising:

providing a resist stack structure;

determining an exposure response at a plane within said resist stack structure; and wherein said step of providing a projection impulse response further comprises said exposure response at said plane of said resist stack structure.

8. The method of claim 7, further comprising determining an exposure response at a plurality of planes within said resist stack structure, and said step of forming a generalized bilinear kernel comprises forming an average generalized bilinear kernel comprised of said exposure responses for each of said plurality of planes.

9. The method of claim 7 wherein said exposure response further comprises a resist blur function.

10. The method of claim 7, further comprising determining an exposure response at a plurality of defocus positions, and said step of forming a generalized bilinear kernel comprises forming an average generalized bilinear kernel comprised of said exposure responses for each of said plurality of defocus positions.

11. The method of claim 1 wherein said projection impulse response comprises a lens defocus different from zero.

12. The method of claim 1 further comprising providing an illumination polarization distribution, and wherein said projection impulse response is a vector impulse response.

13. The method of claim 1, further comprising forming a decomposition of said generalized bilinear kernel.

14. The method of claim 13, wherein said forming a decomposition of said generalized bilinear kernel further comprises the steps of:
providing a first grid of an integration region of interest;
tabulating values of said generalized bilinear kernel at grid points of said region of interest;
remapping the tabulated values of said generalized bilinear kernel to a reduced basis;
determining dominant eigenfunctions of said generalized bilinear kernel in the reduced basis;
converting the dominant eigenfunctions of the said generalized bilinear kernel to the first grid;
convolving the converted dominant eigenfunctions with a set of polygon sectors to form precomputed sector convolutions for each of said converted dominant eigenfunctions.

15. The method of claim 14, further comprising:
providing a mask transmission function;
decomposing said mask transmission function into a subset of said set of polygon sectors;
forming a weighted pre-image comprising a coherent sum of said precomputed sector convolutions for each of said convened dominant eigenfunctions;
forming the image comprising the incoherent sum of the weighted pre-images of all of said converted dominant eigenfunctions.

16. The method of claim 14, further comprising, after providing the first grid of an integration region of interest, folding the region of interest according to the symmetry of the system, and wherein said tabulating values of said generalized bilinear kernel is performed at grid points in the folded region of interest.

17. The method of claim 16, further comprising, after the step of converting the eigenfunctions to the first grid, iteratively refining the convened dominant eigenfunctions against the tabulated values of the generalized bilinear kernel.

18. The method of claim 1 wherein said at least one non-scalar effect is selected from the group consisting of lens birefringence, tailored source polarizations, blurring imposed by optics, and blurring imposed by multiple reflections within a film stack.

19. A method for determining an image formed by a lithographic process including a projection system having an illumination source of illumination energy and a projection lens for projecting the illumination energy, wherein a mask is disposed between the illumination source and the projection lens, the method comprising the steps of:
providing a scalar source intensity distribution;
providing an projection impulse response;
providing an exposure response of the lithographic process including a resist blur function;
forming a generalized bilinear kernel comprising an autocorrelation of the scalar source intensity distribution with a combination of the projection impulse response and the exposure response, wherein said generalized bilinear kernel comprises at least one non-scalar effect due to the vector character of the electric field of the illumination energy.

20. An article of manufacture comprising a computer-usable medium having computer readable program code means embodied therein for determining an image formed by means including a projection system having an illumination source of illumination energy and a projection lens for projecting the illumination energy, wherein a mask is disposed between the illumination source and the projection lens, the computer readable program code means in said article of manufacture comprising:
computer readable program code means for providing a source intensity distribution;
computer readable program code means for providing a projection impulse response; and
computer readable program code means for forming a generalized bilinear kernel comprising an autocorrelation of the source intensity distribution with the projection impulse response, wherein said generalized bilinear kernel comprises at least one non-scalar effect due to the vector character of the electric field of the illumination energy.

21. The article of manufacture of claim 20 wherein the computer readable program code means in said article of manufacture further comprises:
computer readable program code means for providing a first grid of an integration region of interest;
computer readable program code means for tabulating values of said generalized bilinear kernel at grid points of said region of interest;
computer readable program code means for remapping the tabulated values of said generalized bilinear kernel to a reduced basis;
computer readable program code means for determining dominant eigenfunctions of said generalized bilinear kernel in the reduced basis;
computer readable program code means for converting the dominant eigenfunctions of the said generalized bilinear kernel to the first grid;
computer readable program code means for convolving the dominant eigenfunctions with a set of possible polygon sectors to form precomputed sector convolutions for each of said dominant eigenfunctions.

22. A program storage device readable by a machine, tangibly embodying a program of instructions executable by the machine to perform method steps for determining an image formed by means including a projection system having an illumination source of illumination energy and a projection lens for projecting the illumination energy, wherein a mask is disposed between the illumination source and the projection lens, said method steps comprising:
providing a source intensity distribution;
providing a projection impulse response; and
forming a generalized bilinear kernel comprising an autocorrelation of the source intensity distribution with the projection impulse response, wherein said generalized bilinear kernel comprises at least one non-scalar effect due to the vector character of the electric field of the illumination energy.

23. The program storage device of claim 22 wherein said method steps further comprise:
   providing a first grid of an integration region of interest;
   tabulating values of said generalized bilinear kernel at grid points of said region of interest;
   remapping the tabulated values of said generalized bilinear kernel to a reduced basis;
   determining dominant eigenfunctions of said generalized bilinear kernel in the reduced basis;
   converting the dominant eigenfunctions of the said generalized bilinear kernel to the first grid;
   convolving the dominant eigenfunctions with a set of possible polygon sectors to form precomputed sector convolutions for each of said dominant eigenfunctions.

24. A method for determining an image formed by means including a projection system having an illumination source of illumination energy and a projection lens for projecting the illumination energy, wherein a mask is disposed between the illumination source and the projection lens, the method comprising the steps of:
   providing a source intensity distribution;
   providing a projection impulse response, said projection impulse response comprising an impulse response of the projection lens to the illumination energy; and
   forming a generalized bilinear kernel comprising an autocorrelation of the source intensity distribution with the projection impulse response, wherein said generalized bilinear kernel comprises mask blur.

* * * * *